(12) United States Patent
Uchida

(10) Patent No.: US 11,619,686 B2
(45) Date of Patent: *Apr. 4, 2023

(54) MAGNETIC SENSOR AND MAGNETIC SENSOR SYSTEM

(71) Applicant: TDK CORPORATION, Tokyo (JP)

(72) Inventor: Keisuke Uchida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 164 days.

This patent is subject to a terminal disclaimer.

(21) Appl. No.: 17/227,779

(22) Filed: Apr. 12, 2021

(65) Prior Publication Data

US 2021/0231752 A1 Jul. 29, 2021

Related U.S. Application Data

(63) Continuation of application No. 16/409,006, filed on May 10, 2019, now Pat. No. 11,002,805.

(30) Foreign Application Priority Data

Aug. 24, 2018 (JP) .............................. JP2018-156882

(51) Int. Cl.
  *G01R 33/02* (2006.01)
  *G01R 33/09* (2006.01)
  *G01R 33/00* (2006.01)

(52) U.S. Cl.
  CPC ..... *G01R 33/0206* (2013.01); *G01R 33/0017* (2013.01); *G01R 33/09* (2013.01)

(58) Field of Classification Search
  CPC . G01R 33/0206; G01R 33/0017; G01R 33/09
  See application file for complete search history.

(56) References Cited

U.S. PATENT DOCUMENTS

| 10,557,896 | B2 | 2/2020 | Uchida et al. |
| 11,002,805 | B2 * | 5/2021 | Uchida ................. G01R 33/09 |
| 11,035,914 | B2 * | 6/2021 | Watanabe .......... G01R 33/0206 |

(Continued)

FOREIGN PATENT DOCUMENTS

| JP | 2017-167021 A | 9/2017 |
| JP | 2018-004618 A | 1/2018 |

OTHER PUBLICATIONS

Dec. 10, 2020 Declaration Under 37 C.F.R.§1.130 executed in the name of Hiraku Hirabayashi.

(Continued)

*Primary Examiner* — Paresh Patel
(74) *Attorney, Agent, or Firm* — Oliff PLC

(57) ABSTRACT

A magnetic sensor includes a magnetic field converter, a magnetic field detector, and a plurality of shields aligned in a Y direction. The magnetic field converter includes a plurality of yokes. Each yoke has a shape elongated in the Y direction, and is configured to receive an input magnetic field component in a direction parallel to a Z direction and to output an output magnetic field component in a direction parallel to an X direction. The magnetic field detector includes a plurality of trains of elements. Each train of elements includes a plurality of MR elements that are aligned in the Y direction along one yoke and connected in series. Each shield has such a shape that its maximum dimension in the Y direction is smaller than its maximum dimension in the X direction.

19 Claims, 24 Drawing Sheets

(56) References Cited

U.S. PATENT DOCUMENTS

| | | | |
|---|---|---|---|
| 11,320,285 B2* | 5/2022 | Uchida | G01R 33/093 |
| 2012/0200292 A1* | 8/2012 | Sugihara | H01L 43/08 |
| | | | 324/252 |
| 2016/0223623 A1 | 8/2016 | Deak | |
| 2016/0377691 A1 | 12/2016 | Paci et al. | |
| 2017/0328963 A1 | 11/2017 | Schmitt et al. | |
| 2018/0113176 A1 | 4/2018 | Nagata et al. | |
| 2018/0156874 A1 | 6/2018 | Nagata et al. | |
| 2018/0246177 A1* | 8/2018 | Deak | G01R 33/098 |

OTHER PUBLICATIONS

Sep. 14, 2020 Office Action issued in U.S. Appl. No. 16/409,006.
Jan. 13, 2021 Notice of Allowance issued in U.S. Appl. No. 16/409,006.

\* cited by examiner

MAGNETIC SENSOR AND MAGNETIC SENSOR SYSTEM

The present application is a continuation of U.S. patent application Ser. No. 16/409,006, filed on May 10, 2019, which claims priority to Japanese Application 2018-156882, filed on Aug. 24, 2018, the disclosures of each of which are hereby incorporated by reference.

BACKGROUND OF THE INVENTION

1. Field of the Invention

The present invention relates to a magnetic sensor, and a magnetic sensor system including the magnetic sensor.

2. Description of the Related Art

Magnetic sensors have been used for a variety of applications. Examples of known magnetic sensors include one that uses a spin-valve magnetoresistive element provided on a substrate. The spin-valve magnetoresistive element includes a magnetization pinned layer having a magnetization whose direction is fixed, a free layer having a magnetization whose direction is variable depending on the direction of an applied magnetic field, and a gap layer disposed between the magnetization pinned layer and the free layer. In many cases, the spin-valve magnetoresistive element provided on a substrate is configured to have sensitivity to a magnetic field in a direction parallel to the surface of the substrate.

On the other hand, a system including a magnetic sensor may be intended to detect a magnetic field in a direction perpendicular to the surface of a substrate by using a magnetoresistive element provided on the substrate. Magnetic sensors including one or more magnetic field conversion elements formed of a soft magnetic material are known to serve such a purpose. The magnetic field conversion elements convert a magnetic field in a direction perpendicular to the surface of the substrate into a magnetic field in a direction parallel to the surface of the substrate, and supply the converted magnetic field to the magnetoresistive element. Such magnetic sensors are described in US 2016/0223623 A1 and US 2018/0113176 A1, for example.

US 2016/0223623 A1 describes a magnetoresistive sensor including a substrate, a plurality of magnetoresistive sensing elements, and at least one flux guide. The flux guide converts an external magnetic field in a Z-axis direction into a magnetic field component in an X-axis direction. Each magnetoresistive sensing element detects the magnetic field component in the X-axis direction from the flux guide. The flux guide has a long axis parallel to a Y axis, and a short axis parallel to the X axis. The flux guide corresponds to the aforementioned magnetic field conversion element. US 2016/0223623 A1 describes that the flux guide provides a shield against an external magnetic field in the Y-axis direction.

US 2018/0113176 A1 describes a magnetic field detection device including a first soft magnetic layer and a second soft magnetic layer disposed at different positions in the Z-axis direction, and a magnetic detector provided between the first and second soft magnetic layers. The first soft magnetic layer includes a first flat surface parallel to an X-Y plane. The second soft magnetic layer includes a second flat surface parallel to the X-Y plane. The first and second flat surfaces are opposed to each other. At least one of the first and second flat surfaces is provided with one or more protrusions. The protrusions bend a magnetic flux caused by an external magnetic field component in the Z-axis direction into a direction along the X-Y plane, which is the magnetic sensing direction of the magnetic detector, and guide the magnetic flux toward the magnetic detector. Each protrusion corresponds to the aforementioned magnetic field conversion element. The first and second soft magnetic layers exhibit a shielding effect against the external magnetic field component in the direction along the X-Y plane.

US 2018/0113176 A1 further describes that making LX/LY fall within the range from 1 to 4 inclusive makes it possible for the first and second soft magnetic layers to more effectively prevent an external magnetic field in the Y-axis direction from reaching the magnetic detector, where LX represents a dimension of each of the first and second soft magnetic layers in the X-axis direction, and LY represents a dimension thereof in the Y-axis direction.

The magnetic sensor including the foregoing magnetic field conversion element has a problem that if a magnetic field in a direction parallel to the surface of the substrate is applied to the magnetic sensor, the magnetic field can cause an error in the detection signal of the magnetic sensor or lower the sensitivity of the magnetic sensor.

As described above, US 2016/0223623 A1 describes that the flux guide provides a shield against the external magnetic field in the Y-axis direction. However, if the external magnetic field in the Y-axis direction has a high strength, it may be difficult to sufficiently shield it with the flux guide alone.

A conceivable solution to this is to add a shield like the soft magnetic layer described in US 2018/0113176 A1 to the magnetic sensor including the magnetic field conversion element.

It has been found, however, that a magnetic sensor including a plurality of magnetoresistive elements and one or more magnetic field conversion elements can fail to allow the shield to exhibit a sufficient shielding effect even if the shield is arranged to cover all the magnetoresistive elements and the magnetic field conversion element(s).

SUMMARY OF THE INVENTION

It is an object of the present invention to provide a magnetic sensor including a magnetic field detector and a magnetic field converter, the magnetic field converter converting an input magnetic field component in a predetermined direction of an input magnetic field into an output magnetic field component and supplying the output magnetic field component to the magnetic field detector, the magnetic sensor being capable of preventing the occurrence of problems in the case where the input magnetic field contains not only the input magnetic field component but also a magnetic field component in a direction different from the direction of the input magnetic field component, and to provide a magnetic sensor system including such a magnetic sensor.

A magnetic sensor of the present invention includes a magnetic field converter, a magnetic field detector, and a plurality of shields separated from each other, each of the plurality of shields being formed of a soft magnetic material. The magnetic field converter includes one or more yokes each formed of a soft magnetic material. Each of the one or more yokes is configured to receive an input magnetic field for the magnetic sensor and to output an output magnetic field. The input magnetic field contains an input magnetic field component in a direction parallel to a first direction. As viewed in a direction parallel to the first direction, each of the one or more yokes has a shape elongated in a second direction intersecting the first direction. The output magnetic field contains an output magnetic field component in a direction parallel to a third direction intersecting the first and second directions, the output magnetic field component varying depending on the input magnetic field component.

The magnetic field detector generates a detection signal dependent on the output magnetic field component. The magnetic field detector includes one or more magnetic detection elements. Each of the one or more magnetic detection elements is configured to receive the output magnetic field and to generate a detection value which varies depending on the output magnetic field component. The detection signal depends on the detection value.

As viewed in a direction parallel to the first direction, the plurality of shields are aligned in the second direction and overlap the magnetic field converter and the magnetic field detector. As viewed in a direction parallel to the first direction, each of the plurality of shields has such a shape that its maximum dimension in the second direction is smaller than its maximum dimension in the third direction.

In the magnetic sensor of the present invention, the magnetic field detector may include a plurality of magnetic detection elements as the one or more magnetic detection elements. As viewed in a direction parallel to the first direction, each of the plurality of magnetic detection elements may be located inside the perimeter of any one of the plurality of shields.

The magnetic field converter may include a plurality of yokes as the one or more yokes. As viewed in a direction parallel to the first direction, each of the plurality of yokes may be located inside the perimeter of any one of the plurality of shields.

The plurality of magnetic detection elements may constitute one or more trains of elements. Each of the one or more trains of elements may include two or more of the plurality of magnetic detection elements that are aligned in the second direction along the one or more yokes and connected in series.

The one or more trains of elements may be a plurality of trains of elements. The magnetic field detector may include a power supply port configured to receive a predetermined voltage, a ground port connected to a ground, an output port, a first resistor section provided between the power supply port and the output port, and a second resistor section provided between the output port and the ground port. In such a case, each of the first and second resistor sections may include one or more of the plurality of trains of elements. The detection signal may depend on the potential at the output port.

The one or more trains of elements may be four or more trains of elements. The magnetic field detector may include a power supply port configured to receive a predetermined voltage, a ground port connected to a ground, a first output port, a second output port, a first resistor section provided between the power supply port and the first output port, a second resistor section provided between the first output port and the ground port, a third resistor section provided between the power supply port and the second output port, and a fourth resistor section provided between the second output port and the ground port. In such a case, each of the first to fourth resistor sections may include one or more of the four or more trains of elements. The detection signal may depend on a potential difference between the first output port and the second output port. In the magnetic sensor of the present invention, the first, second and third directions may be orthogonal to one another.

In the magnetic sensor of the present invention, each of the one or more magnetic detection elements may be a magnetoresistive element. The magnetoresistive element includes a magnetization pinned layer having a magnetization in a predetermined direction, and a free layer having a magnetization whose direction is variable depending on an applied magnetic field. The detection value may vary depending on an angle that the direction of the magnetization of the free layer forms with respect to the direction of the magnetization of the magnetization pinned layer. The direction of the magnetization of the magnetization pinned layer may be parallel to the third direction. In the magnetic sensor of the present invention, the input magnetic field may contain not only the input magnetic field component but also a magnetic field component in a direction parallel to the second direction.

A magnetic sensor system of the present invention includes the magnetic sensor of the present invention, and a magnetic field generator for generating a predetermined magnetic field. The magnetic sensor and the magnetic field generator are configured so that a partial magnetic field is applied to the magnetic sensor, the partial magnetic field being part of the predetermined magnetic field. The partial magnetic field contains a first magnetic field component in a direction parallel to the first direction, and a second magnetic field component in a direction parallel to the second direction. The input magnetic field is the partial magnetic field. The input magnetic field component is the first magnetic field component.

In the magnetic sensor system of the present invention, the magnetic sensor and the magnetic field generator may be configured so that the first magnetic field component varies as the relative position of the magnetic field generator with respect to the magnetic sensor varies.

According to the magnetic sensor and the magnetic sensor system of the present invention, the provision of the plurality of shields serves to prevent the occurrence of problems in the case where the input magnetic field contains not only the input magnetic field component but also a magnetic field component in a direction different from the direction of the input magnetic field component.

Other and further objects, features and advantages of the present invention will appear more fully from the following description.

DETAILED DESCRIPTION OF THE PREFERRED EMBODIMENTS

First Embodiment

Figure 1:
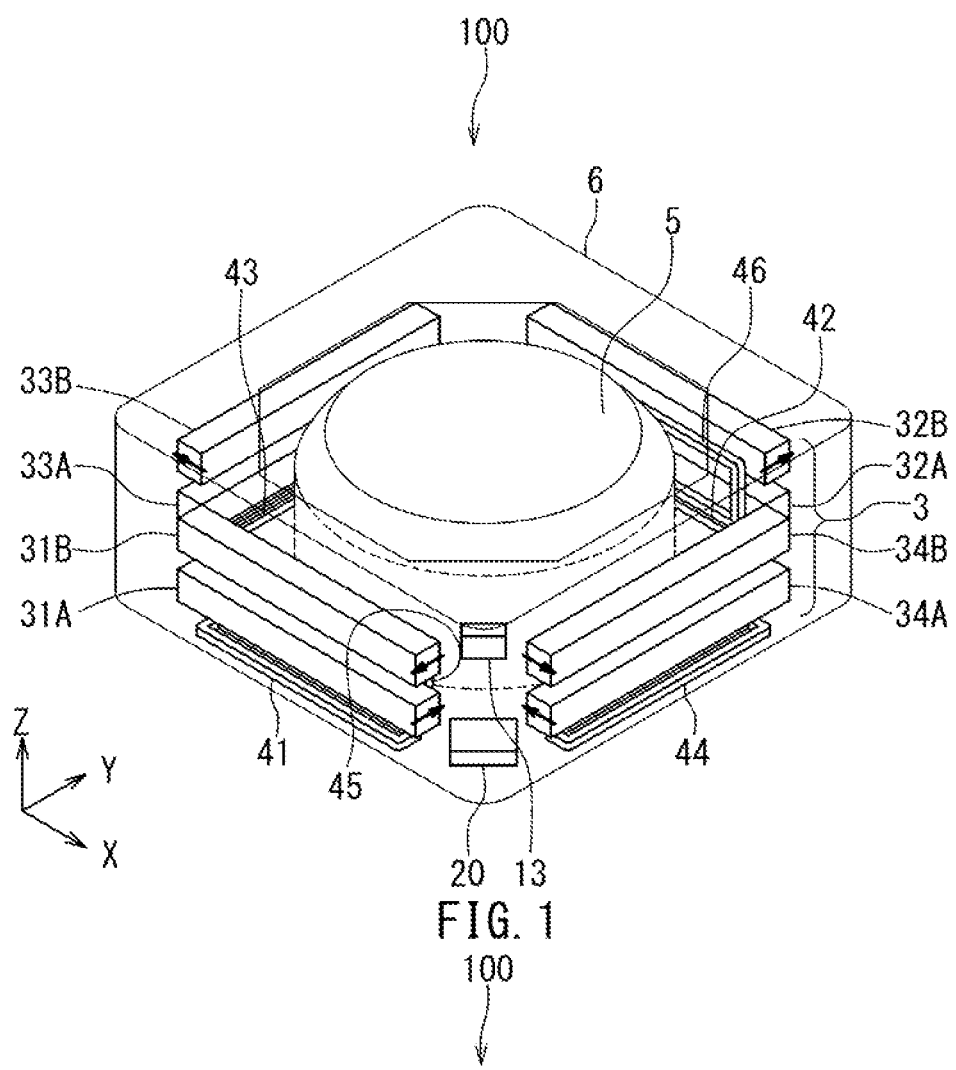
FIG. 1 is a perspective view of a camera module including a magnetic sensor system according to a first embodiment of the invention.
Figure 2:
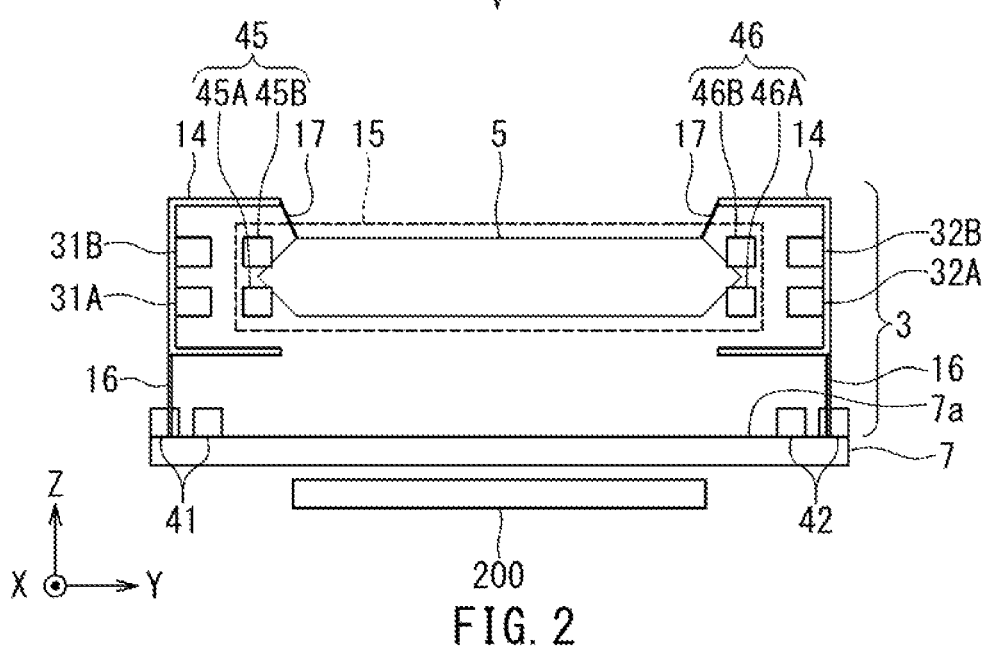
FIG. 2 illustrates an internal schematic view of the camera module of FIG. 1.

Preferred embodiments of the present invention will now be described in detail with reference to the drawings. First, reference is made to FIG. 1 and FIG. 2 to describe the configuration of a camera module including a magnetic sensor system according to a first embodiment of the invention. FIG. 1 is a perspective view of the camera module 100. FIG. 2 illustrates a schematic internal view of the camera module 100. For ease of understanding, in FIG. 2 the parts of the cameral module 100 are drawn on a different scale and in a different layout than those in FIG. 1. The camera module 100 constitutes, for example, a portion of a camera for a smartphone having an optical image stabilization mechanism and an autofocus mechanism, and is used in combination with an image sensor 200 that uses CMOS or other similar techniques.

The camera module 100 includes a driving device 3, a lens 5, a housing 6 and a substrate 7. The driving device 3 is to move the lens 5. The driving device 3 includes the magnetic sensor system according to the present embodiment. The magnetic sensor system will be described later. The housing 6 is to protect the driving device 3. The substrate 7 has a top surface 7a. FIG. 1 omits the illustration of the substrate 7, and FIG. 2 omits the illustration of the housing 6.

Now, we define X, Y, and Z directions as shown in FIGS. 1 and 2. The X, Y, and Z directions are orthogonal to one another. In the present embodiment, the Z direction is a direction perpendicular to the top surface 7a of the substrate 7. In FIG. 2 the Z direction is the upward direction. The X and Y directions are both parallel to the top surface 7a of the substrate 7. The directions opposite to the X, Y, and Z directions will be referred to as −X, −Y, and −Z directions, respectively. As used herein, the term "above" refers to positions located forward of a reference position in the Z direction, and "below" refers to positions located on a side of the reference position opposite from "above".

The lens 5 is disposed above the top surface 7a of the substrate 7 in such an orientation that the direction of its optical axis is parallel to the Z direction. The substrate 7 has an opening (not illustrated) for passing light that has passed through the lens 5. As shown in FIG. 2, the camera module 100 is in alignment with the image sensor 200 so that light that has passed through the lens 5 and the non-illustrated opening will enter the image sensor 200.

Figure 3:
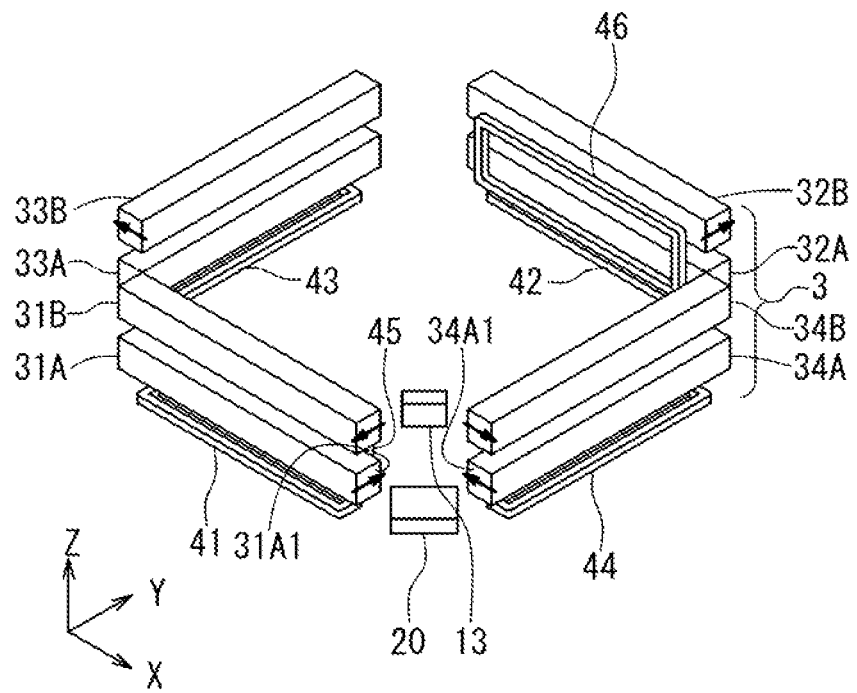
FIG. 3 is a perspective view of a driving device of the camera module of FIG. 1.
Figure 4:
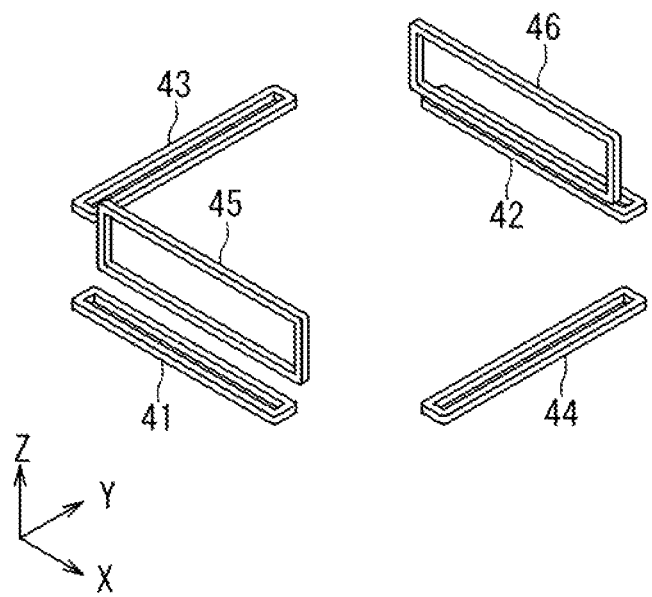
FIG. 4 is a perspective view of a plurality of coils of the driving device of FIG. 1.
Figure 5:
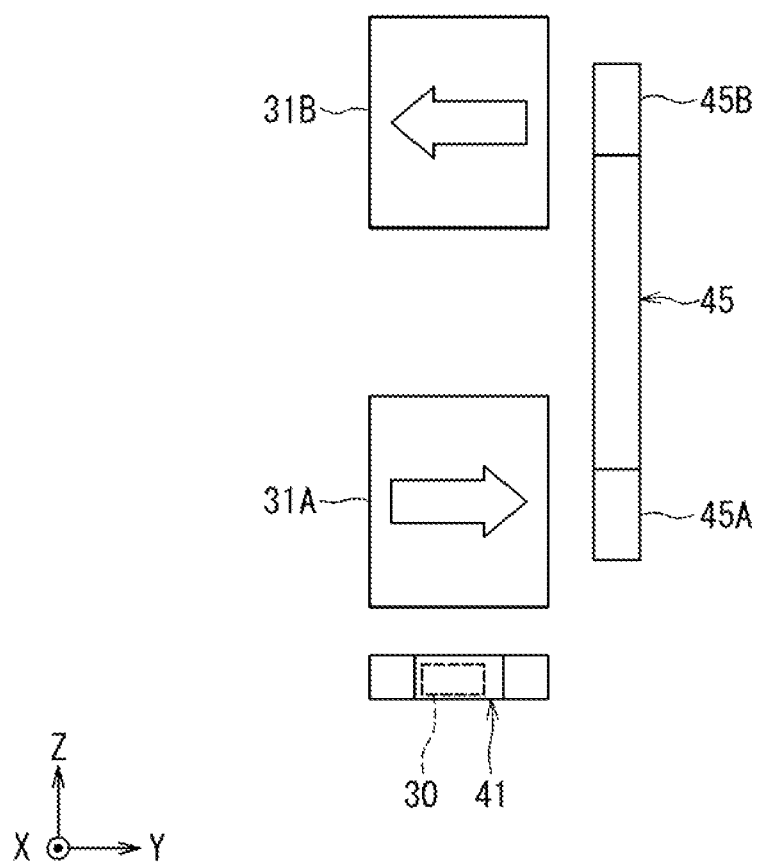
FIG. 5 is a side view illustrating the principal parts of the driving device of FIG. 1.

The driving device 3 will now be described in detail with reference to FIG. 2 to FIG. 5. FIG. 3 is a perspective view of the driving device 3. FIG. 4 is a perspective view of a plurality of coils of the driving device 3. FIG. 5 is a side view illustrating the principal parts of the driving device 3.

The driving device 3 includes a first holding member 14, a second holding member 15, a plurality of first wires 16, and a plurality of second wires 17. The second holding member 15 is to hold the lens 5. Although not illustrated, the second holding member 15 is shaped like a hollow cylinder so that the lens 5 is insertable in the hollow.

The second holding member 15 is provided such that its position is variable in one direction, specifically, in the direction of the optical axis of the lens 5, i.e., a direction parallel to the Z direction, with respect to the first holding member 14. In the present embodiment, the first holding member 14 is shaped like a box so that the lens 5 and the second holding member 15 can be accommodated therein. The plurality of second wires 17 connect the first and second holding members 14 and 15 and support the second holding member 15 such that the second holding member 15 is movable with respect to the first holding member 14 in a direction parallel to the Z direction.

The first holding member 14 is provided above the top surface 7a of the substrate 7 such that its position is variable with respect to the substrate 7 in a direction parallel to the X direction and in a direction parallel to the Y direction. The plurality of first wires 16 connect the substrate 7 and the first holding member 14, and support the first holding member 14 such that the first holding member 14 is movable with respect to the substrate 7 in the direction parallel to the X direction and in the direction parallel to the Y direction. When the relative position of the first holding member 14 with respect to the substrate 7 varies, the relative position of the second holding member 15 with respect to the substrate 7 also varies.

The driving device 3 further includes magnets 31A, 31B, 32A, 32B, 33A, 33B, 34A and 34B, and coils 41, 42, 43, 44, 45 and 46. The magnet 31A is located forward of the lens 5 in the −Y direction. The magnet 32A is located forward of the lens 5 in the Y direction. The magnet 33A is located forward of the lens 5 in the −X direction. The magnet 34A is located forward of the lens 5 in the X direction. The magnets 31B, 32B, 33B and 34B are located above the magnets 31A, 32A, 33A and 34A, respectively. The magnets 31A, 31B, 32A, 32B, 33A, 33B, 34A and 34B are fixed to the first holding member 14.

As shown in FIG. 3, the magnets 31A, 31B, 32A and 32B each have a rectangular parallelepiped shape elongated in the X direction. The magnets 33A, 33B, 34A and 34B each have a rectangular parallelepiped shape elongated in the Y direction. The magnets 31A and 32B are magnetized in the Y direction. The magnets 31B and 32A are magnetized in the −Y direction. The magnets 33A and 34B are magnetized in the X direction. The magnets 33B and 34A are magnetized in the −X direction. In FIGS. 1 and 3, the magnetization directions of the magnets 31A, 31B, 32B, 33B, 34A and 34B are indicated by the arrows drawn to overlap the respective magnets. In FIG. 5 the magnetization directions of the magnets 31A and 31B are indicated by the arrows drawn inside the magnets 31A and 31B.

The magnet 31A has an end face 31A1 located at the end in the X direction of the magnet 31A. The magnet 34A has an end face 34A1 located at the end in the −Y direction of the magnet 34A.

The coil 41 is located between the magnet 31A and the substrate 7. The coil 42 is located between the magnet 32A and the substrate 7. The coil 43 is located between the magnet 33A and the substrate 7. The coil 44 is located between the magnet 34A and the substrate 7. The coil 45 is located between the lens 5 and the magnets 31A and 31B. The coil 46 is located between the lens 5 and the magnets 32A and 32B. The coils 41, 42, 43 and 44 are fixed to the substrate 7. The coils 45 and 46 are fixed to the second holding member 15.

The coil 41 is subjected mainly to a magnetic field generated by the magnet 31A. The coil 42 is subjected mainly to a magnetic field generated by the magnet 32A. The coil 43 is subjected mainly to a magnetic field generated by the magnet 33A. The coil 44 is subjected mainly to a magnetic field generated by the magnet 34A.

As shown in FIGS. 2, 4 and 5, the coil 45 includes a first conductor portion 45A extending along the magnet 31A in the X direction, a second conductor portion 45B extending along the magnet 31B in the X direction, and two third conductor portions connecting the first and second conductor portions 45A and 45B. As shown in FIGS. 2 and 4, the coil 46 includes a first conductor portion 46A extending along the magnet 32A in the X direction, a second conductor portion 46B extending along the magnet 32B in the X direction, and two third conductor portions connecting the first and second conductor portions 46A and 46B.

The first conductor portion 45A of the coil 45 is subjected mainly to a component in the Y direction of the magnetic field generated by the magnet 31A. The second conductor portion 45B of the coil 45 is subjected mainly to a component in the −Y direction of a magnetic field generated by the magnet 31B. The first conductor portion 46A of the coil 46 is subjected mainly to a component in the −Y direction of the magnetic field generated by the magnet 32A. The second conductor portion 46B of the coil 46 is subjected mainly to a component in the Y direction of a magnetic field generated by the magnet 32B.

The driving device 3 further includes a magnetic sensor 30 disposed on the inner side of one of the coils 41 and 42 and fixed to the substrate 7, and a magnetic sensor 30 disposed on the inner side of one of the coils 43 and 44 and fixed to the substrate 7. Assume here that the two magnetic sensors 30 are disposed on the inner sides of the coils 41 and 44, respectively. As will be described later, the two magnetic sensors 30 are used to adjust the position of the lens 5 to reduce the effect of hand-induced camera shake.

The magnetic sensor 30 disposed on the inner side of the coil 41 detects the magnetic field generated by the magnet 31A and outputs a detection signal corresponding to the position of the magnet 31A. The magnetic sensor 30 disposed on the inner side of the coil 44 detects the magnetic field generated by the magnet 34A and outputs a detection signal corresponding to the position of the magnet 34A. The configuration of the magnetic sensors 30 will be described later.

The driving device 3 further includes a magnet 13 and a magnetic sensor 20. The magnetic sensor 20 is used to detect the position of the lens 5 during automatic focusing. The magnetic sensor 20 is fixed to the substrate 7 at a position near the end face 31A1 of the magnet 31A and the end face 34A1 of the magnet 34A. For example, the magnetic sensor 20 is constructed of elements for detecting magnetic fields, such as magnetoresistive elements.

The magnet 13 is disposed above the magnetic sensor 20 and fixed to the second holding member 15. The magnet 13 has a rectangular parallelepiped shape. When the relative position of the second holding member 15 with respect to the first holding member 14 varies in a direction parallel to the Z direction, the relative position of the magnet 13 with respect to the first holding member 14 also varies in the direction parallel to the Z direction.

Reference is now made to FIG. 2 to FIG. 5 to describe the operation of the driving device 3. The driving device 3 constitutes part of optical image stabilization and autofocus mechanisms. Such mechanisms will be briefly described first. A control unit (not illustrated) external to the camera module 100 controls the driving device 3, the optical image stabilization mechanism and the autofocus mechanism.

The optical image stabilization mechanism is configured to detect hand-induced camera shake using, for example, a gyrosensor external to the camera module 100. Upon detection of hand-induced camera shake by the optical image stabilization mechanism, the non-illustrated control unit controls the driving device 3 so as to vary the relative position of the lens 5 with respect to the substrate 7 depending on the mode of the camera shake. This stabilizes the absolute position of the lens 5 to reduce the effect of the camera shake. The relative position of the lens 5 with respect to the substrate 7 is varied in a direction parallel to the X direction or parallel to the Y direction, depending on the mode of the camera shake.

The autofocus mechanism is configured to detect a state in which focus is achieved on the subject, using, for example, an image sensor 200 or an autofocus sensor. Using the driving device 3, the non-illustrated control unit varies the relative position of the lens 5 with respect to the substrate 7 in a direction parallel to the Z direction so as to achieve focus on the subject. This enables automatic focusing on the subject.

Next, a description will be given of the operation of the driving device 3 related to the optical image stabilization mechanism. When currents are passed through the coils 41 and 42 by the non-illustrated control unit, the first holding member 14 with the magnets 31A and 32A fixed thereto moves in a direction parallel to the Y direction due to interaction between the magnetic fields generated by the magnets 31A and 32A and the magnetic fields generated by the coils 41 and 42. As a result, the lens 5 also moves in the direction parallel to the Y direction. On the other hand, when currents are passed through the coils 43 and 44 by the non-illustrated control unit, the first holding member 14 with the magnets 33A and 34A fixed thereto moves in a direction parallel to the X direction due to interaction between the magnetic fields generated by the magnets 33A and 34A and the magnetic fields generated by the coils 43 and 44. As a result, the lens 5 also moves in the direction parallel to the X direction. The non-illustrated control unit detects the position of the lens 5 by measuring signals corresponding to the positions of the magnets 31A and 34A, which are generated by the two magnetic sensors 30.

Next, the operation of the driving device 3 related to the autofocus mechanism will be described. To move relative the position of the lens 5 with respect to the substrate 7 in the Z direction, the non-illustrated control unit passes a current through the coil 45 such that the current flows through the first conductor portion 45A in the X direction and flows through the second conductor portion 45B in the −X direction, and passes a current through the coil 46 such that the current flows through the first conductor portion 46A in the −X direction and flows through the second conductor portion 46B in the X direction. These currents and the magnetic fields generated by the magnets 31A, 31B, 32A and 32B cause a Lorentz force in the Z direction to be exerted on the first and second conductor portions 45A and 45B of the coil 45 and the first and second conductor portions 46A and 46B of the coil 46. This causes the second holding member 15 with the coils 45 and 46 fixed thereto to move in the Z direction. As a result, the lens 5 also moves in the Z direction.

To move the relative position of the lens 5 with respect to the substrate 7 in the −Z direction, the non-illustrated control unit passes currents through the coils 45 and 46 in directions opposite to those in the case of moving the relative position of the lens 5 with respect to the substrate 7 in the Z direction.

When the relative position of the lens 5 with respect to the substrate 7 varies in a direction parallel to the Z direction, the relative position of the magnet 13 with respect to the magnetic sensor 20 also varies in the direction parallel to the Z direction. The magnetic sensor 20 detects at least a magnetic field generated by the magnet 13, and generates a signal corresponding to the position of the magnet 13. The non-illustrated control unit detects the position of the lens 5 by measuring the signal generated by the magnetic sensor 20.

A schematic configuration of the magnetic sensor system according to the present embodiment will now be described with reference to FIGS. 1 to 5. The magnetic sensor system according to the present embodiment includes a magnetic sensor according to the present embodiment, and a magnetic field generator for generating a predetermined magnetic field. In the present embodiment, the magnetic sensor 30 disposed on the inner side of the coil 41 or the magnetic sensor 30 disposed on the inner side of the coil 44 corresponds to the magnetic sensor according to the present embodiment. For the magnetic sensor system having the magnetic sensor 30 disposed on the inner side of the coil 41, the magnet 31A corresponds to the magnetic field generator. For the magnetic sensor system having the magnetic sensor 30 disposed on the inner side of the coil 44, the magnet 34A corresponds to the magnetic field generator.

Figure 6:
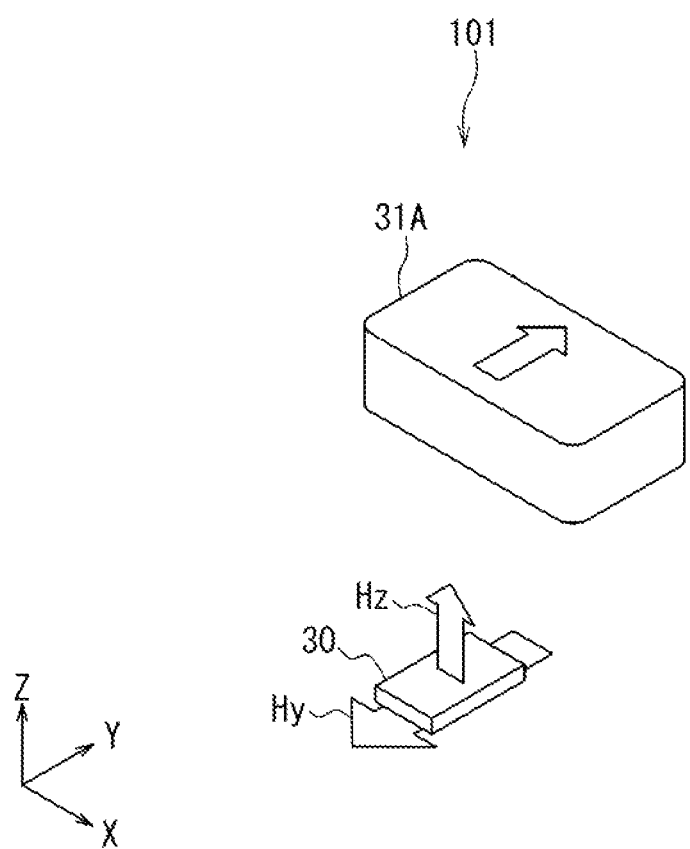
FIG. 6 is a perspective view illustrating the principal parts of the magnetic sensor system according to the first embodiment of the invention.

Reference is now made to FIG. 6 to describe the magnetic sensor system 101 having the magnetic sensor 30 disposed on the inner side of the coil 41. FIG. 6 is a perspective view illustrating the principal parts of the magnetic sensor system 101. For ease of understanding, in FIG. 6, the coil 41 is omitted and the magnet 31A is drawn on a different scale and in a different location than those in FIGS. 1 to 3 and 5. Hereinafter, unless otherwise specified, the magnetic sensor 30 disposed on the inner side of the coil 41 will be simply referred to as the magnetic sensor 30, and may also be referred to as the magnetic sensor 30 according to the present embodiment.

The magnetic sensor 30 and the magnetic field generator, i.e., the magnet 31A, are configured so that a partial magnetic field is applied to the magnetic sensor 30. The partial magnetic field is part of the magnetic field generated by the magnet 31A. The partial magnetic field contains a first magnetic field component Hz parallel to the Z direction and a second magnetic field component Hy parallel to the Y direction. The Z direction corresponds to the first direction in the present invention. The Y direction corresponds to the second direction in the present invention.

In the present embodiment, as shown in FIG. 6, the magnet 31A is magnetized in the Y direction, and the second magnetic field component Hy is in the −Y direction. In FIG. 6, the first magnetic field component Hz when the magnet 31A has moved in the Y direction from the position shown in FIG. 5 is shown.

As described previously, the magnetic sensor 30 is fixed to the substrate 7 and the magnet 31A is fixed to the first holding member 14 (see FIG. 2). When the position of the first holding member 14 with respect to the substrate 7 varies in a direction parallel to the Y direction, the relative position of the magnet 31A with respect to the magnetic sensor 30 also varies in the direction parallel to the Y direction. The detection signal of the magnetic sensor 30 corresponds to the relative position of the magnet 31A with respect to the magnetic sensor 30 in a direction parallel to the Y direction. Hereinafter, the relative position of the magnet 31A with respect to the magnetic sensor 30 in a direction parallel to the Y direction will also be referred to as the detection-target position. The magnetic sensor system 101 is a position detection device for detecting the detection-target position.

The magnetic sensor 30 and the magnet 31A are also configured so that the first magnetic field component Hz varies as the detection-target position varies. In the present embodiment, the first magnetic field component Hz varies as the first holding member 14 moves in a direction parallel to the Y direction to vary the detection-target position. A description will be given later as to the manner in which the first magnetic field component Hz varies.

Figure 7:
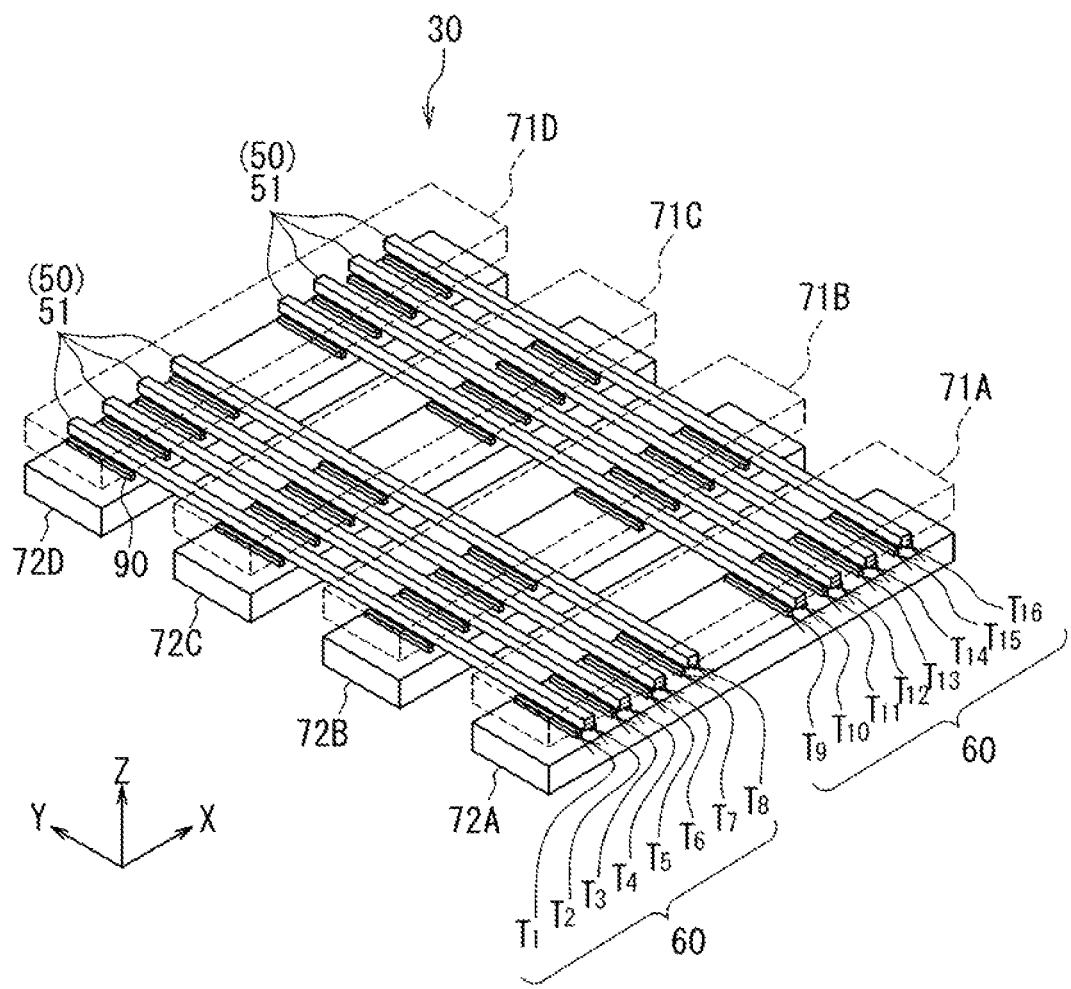
FIG. 7 is a perspective view of a magnetic sensor according to the first embodiment of the invention.
Figure 8:
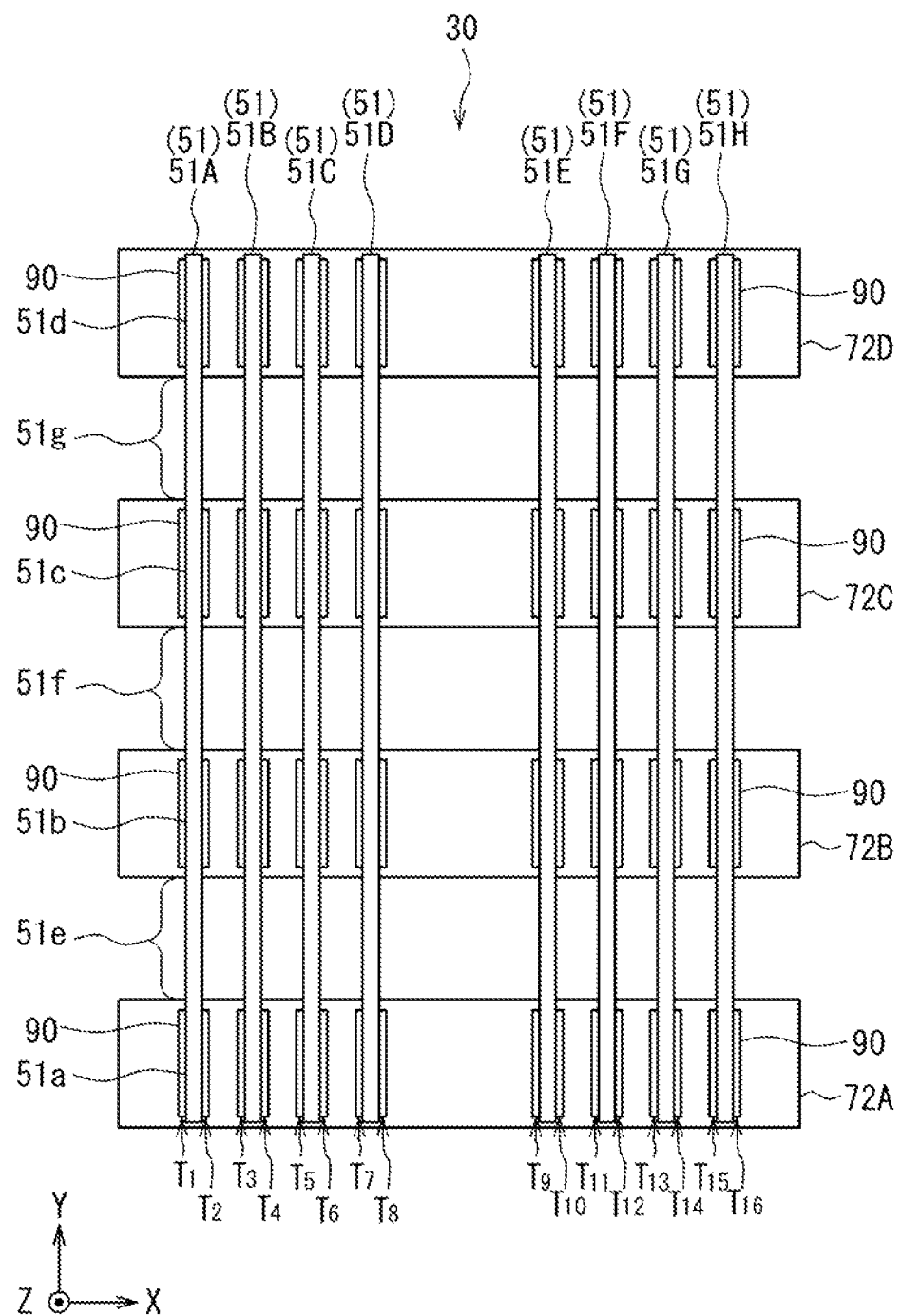
FIG. 8 is a plan view of the magnetic sensor according to the first embodiment of the invention.

The magnetic sensor 30 according to the present embodiment will now be described. FIG. 7 is a perspective view of the magnetic sensor 30. FIG. 8 is a plan view of the magnetic sensor 30. The magnetic sensor 30 includes a magnetic field converter 50, a magnetic field detector 60, and a plurality of shields 71A, 71B, 71C, 71D, 72A, 72B, 72C, and 72D. FIG. 8 omits the illustration of the shields 71A, 71B, 71C, and 71D.

The magnetic field converter 50 includes one or more yokes 51 each formed of a soft magnetic material. Each of the one or more yokes 51 has a shape elongated in the Y direction as viewed in a direction parallel to the Z direction, e.g., as viewed from above. Each of the one or more yokes 51 is configured to receive an input magnetic field and to output an output magnetic field. The input magnetic field contains an input magnetic field component in a direction parallel to the Z direction.

In the present embodiment, the input magnetic field is the foregoing partial magnetic field. The input magnetic field component is the foregoing first magnetic field component Hz (see FIG. 6). The output magnetic field contains an output magnetic field component in a direction parallel to the X direction. The output magnetic field component varies depending on the input magnetic field component. i.e., the first magnetic field component Hz. The X direction corresponds to the third direction in the present invention. In the present embodiment, the first direction (the Z direction), the second direction (the Y direction), and the third direction (the X direction) are orthogonal to one another. The input magnetic field contains not only the input magnetic field component (the first magnetic field component Hz) but also the second magnetic field component Hy, which is a magnetic field component in a direction parallel to the Y direction.

In the present embodiment, as shown in FIGS. 7 and 8, the magnetic field converter 50 includes a plurality of yokes 51 as the one or more yokes 51. Each of the yokes 51 has a rectangular parallelepiped shape elongated in the Y direction, for example. The yokes 51 are identical in shape.

In the present embodiment, the number of the yokes 51 is eight. Hereinafter, the eight yokes 51 are denoted by reference symbols 51A, 51B, 51C, 51D, 51E, 51F, 51G, and 51H for the purpose of distinction from each other. The eight yokes 51A, 51B, 51C, 51D, 51E, 51F, 51G, and 51H are arranged in this order in the X direction.

The magnetic field detector 60 is configured to receive the output magnetic field and to generate a detection signal dependent on the output magnetic field component. This detection signal is the same as the detection signal outputted by the magnetic sensor 30. As described above, the output magnetic field component varies depending on the input magnetic field component (the first magnetic field component Hz). The detection signal thus depends on the input magnetic field component (the first magnetic field component Hz).

The magnetic field detector 60 includes one or more magnetic detection elements 90. Each of the one or more magnetic detection elements 90 is configured to receive the output magnetic field and to generate a detection value which varies depending on the output magnetic field component. The detection signal of the magnetic field detector 60 depends on this detection value.

In the present embodiment, specifically, the magnetic field detector 60 includes a plurality of magnetic detection elements 90 as the one or more magnetic detection elements 90. The plurality of magnetic detection elements 90 constitute one or more trains of elements. Each of the one or more trains of elements includes two or more of the plurality of magnetic detection elements 90 aligned in the Y direction along the one or more yokes 51 and connected in series.

In the present embodiment, each of the plurality of magnetic detection elements 90 is specifically a magnetoresistive (MR) element. Hereinafter, a magnetic detection element 90 will also be referred to as an MR element 90. In the present embodiment, the detection value of each magnetic detection element (MR element) 90 is the resistance value of the MR element 90.

In the present embodiment, the one or more trains of elements are a plurality of trains of elements, specifically four or more trains of elements. In the example shown in FIGS. 7 and 8, there are sixteen trains of elements. Each train of elements is constituted of four MR elements 90. Two trains of elements are associated with one yoke 51. The two trains of elements are disposed near the end in the −Z direction of the yoke 51 and opposed to each other in the X direction, with the yoke 51 in between.

Figure 9:
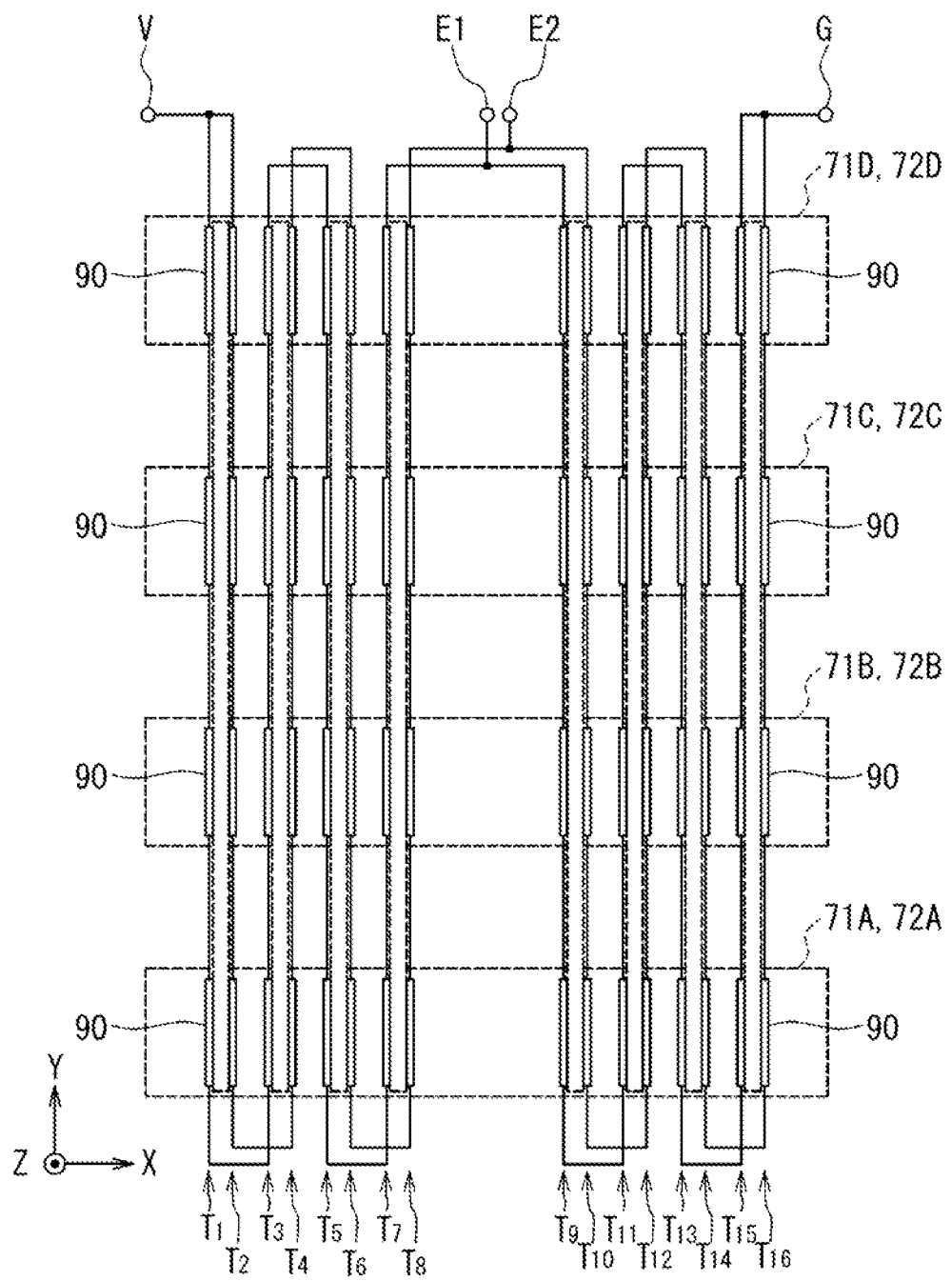
FIG. 9 is a plan view illustrating the connection relationship between a plurality of trains of elements in the magnetic sensor according to the first embodiment of the invention.

FIG. 9 illustrates the connection relationship between the trains of elements. In FIG. 9, the constituent components of the magnetic field converter 50 are indicated in broken lines. In FIGS. 8 and 9, the symbols $T_1$ to $T_{16}$ represent the sixteen trains of elements. The trains of elements $T_1$ and $T_2$ are associated with the yoke 51A. The trains of elements $T_3$ and $T_4$ are associated with the yoke 51B. The trains of elements $T_5$ and $T_6$ are associated with the yoke 51C. The trains of elements $T_7$ and $T_8$ are associated with the yoke 51D. The trains of elements $T_9$ and $T_{10}$ are associated with the yoke 51E. The trains of elements $T_{11}$ and $T_{12}$ are associated with the yoke 51F. The trains of elements $T_{13}$ and $T_{14}$ are associated with the yoke 51G. The trains of elements $T_{15}$ and $T_{16}$ are associated with the yoke 51H. The four MR elements 90 constituting each train of elements are connected in series.

The trains of elements $T_1$, $T_3$, $T_5$, $T_7$, $T_9$, $T_{11}$, $T_{13}$, and $T_{15}$ are disposed on the −X direction side of the yokes 51A, 51B, 51C, 51D, 51E, 51F, 51G, and 51H, respectively. The trains of elements $T_2$, $T_4$, $T_6$, $T_8$, $T_{10}$, $T_{12}$, $T_{14}$, and $T_{16}$ are disposed on the X direction side of the yokes 51A, 51B, 51C, 51D, 51E, 51F, 51G, and 51H, respectively.

Figure 10:
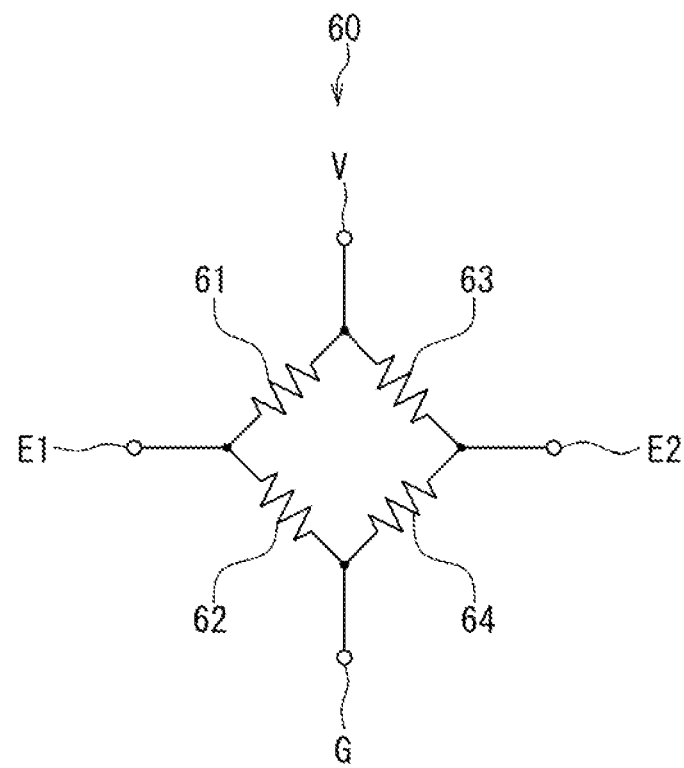
FIG. 10 is a circuit diagram illustrating the circuit configuration of a magnetic field detector of the first embodiment of the invention.

Reference is now made to FIGS. 9 and 10 to describe the circuit configuration of the magnetic field detector 60. FIG. 10 is a circuit diagram illustrating the circuit configuration of the magnetic field detector 60. As shown in FIG. 10, the magnetic field detector 60 includes a power supply port V configured to receive a predetermined voltage, a ground port G connected to the ground, a first output port E1, a second output port E2, a first resistor section 61, a second resistor section 62, a third resistor section 63, and a fourth resistor section 64.

The first resistor section 61 is provided between the power supply port V and the first output port E1. The second resistor section 62 is provided between the first output port E1 and the ground port G. The third resistor section 63 is provided between the power supply port V and the second output port E2. The fourth resistor section 64 is provided between the second output port E2 and the ground port G. The detection signal of the magnetic field detector 60 depends on a potential difference between the first output port E1 and the second output port E2.

Each of the first to fourth resistor sections 61 to 64 includes one or more trains of elements. In the present embodiment, specifically, each of the first to fourth resistor sections 61 to 64 includes four trains of elements connected in series. More specifically, the first resistor section 61 includes the trains of elements $T_1$, $T_3$, $T_5$, and $T_7$ connected in series. The second resistor section 62 includes the trains of elements $T_9$, $T_{11}$, $T_{13}$, and $T_{15}$ connected in series. The third resistor section 63 includes the trains of elements $T_2$, $T_4$, $T_6$, and $T_8$ connected in series. The fourth resistor section 64 includes the trains of elements $T_{10}$, $T_{12}$, $T_{14}$, and $T_{16}$ connected in series.

Figure 11:
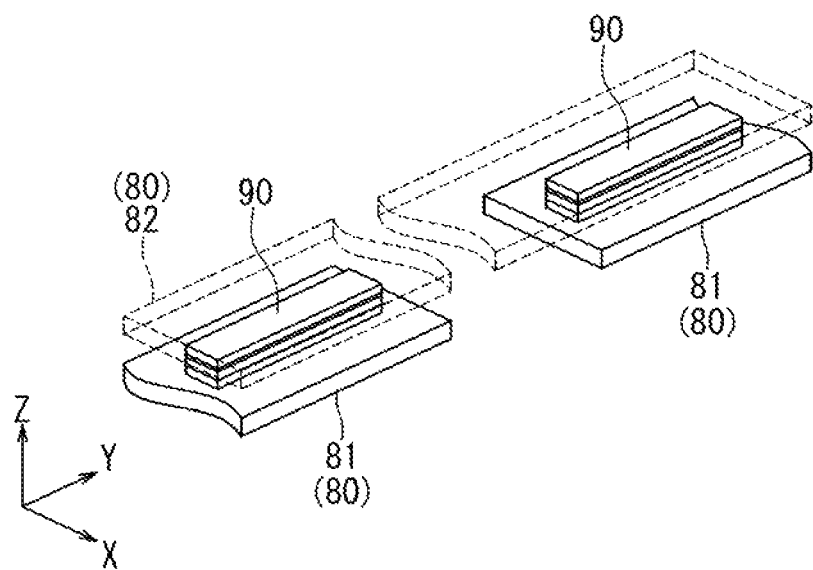
FIG. 11 is a perspective view illustrating part of a wiring section and magnetoresistive elements of the first embodiment of the invention.

The magnetic field detector 60 includes a wiring section 80 for electrically connecting the plurality of MR elements 90. Now, the wiring section 80 will be described with reference to FIG. 11. FIG. 11 is a perspective view illustrating part of the wiring section 80 and MR elements 90. The wiring section 80 includes a plurality of upper electrodes 82 and a plurality of lower electrodes 81 for electrically connecting four MR elements 90 constituting each train of elements. The MR elements 90 are disposed on the lower electrodes 81. The upper electrodes 82 are disposed on the MR elements 90.

The MR elements 90, the upper electrodes 82, and the lower electrodes 81 are connected in the following relationship. Each of the lower electrodes 81 is shaped to be narrow and elongated in the Y direction. Every two lower electrodes 81 that are adjacent to each other in the Y direction have a gap therebetween. The MR elements 90 are provided on the top surfaces of the lower electrodes 81 at positions near opposite ends in the Y direction. Each of the upper electrodes 82 electrically connects two adjacent MR elements 90 that are disposed on two lower electrodes 81 adjacent in the Y direction. In such a manner, the four MR elements 90 are connected in series.

The wiring section 80 further includes a plurality of connection electrodes. In each of the first to fourth resistor sections 61 to 64, the connection electrodes electrically connect the lower electrodes 81 so that the plurality of trains of elements are connected in series.

Figure 12:
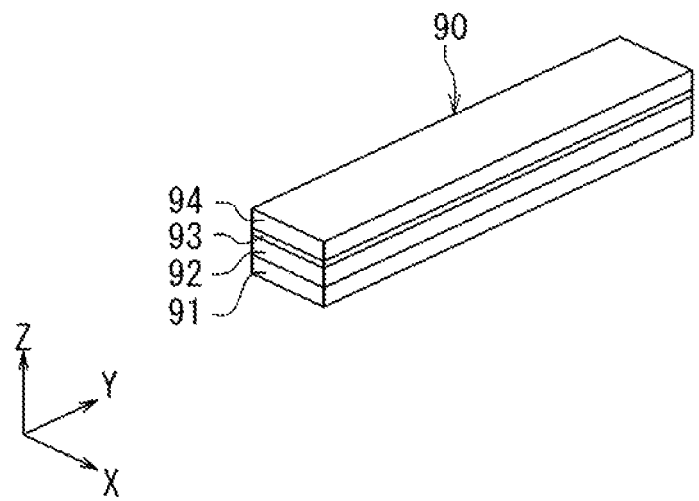
FIG. 12 is a perspective view of a magnetoresistive element of the first embodiment of the invention.

An example of configuration of each MR element 90 will now be described with reference to FIG. 12. FIG. 12 is a perspective view of an MR element 90. In this example, the MR element 90 includes: a magnetization pinned layer 92 having a magnetization in a predetermined direction; a free layer 94 having a magnetization whose direction is variable depending on an applied magnetic field; a gap layer 93 disposed between the magnetization pinned layer 92 and the free layer 94; and an antiferromagnetic layer 91. The antiferromagnetic layer 91, the magnetization pinned layer 92, the gap layer 93, and the free layer 94 are stacked in this order, from closest to farthest, from the lower electrode 81. The antiferromagnetic layer 91 is formed of an antiferromagnetic material, and is in exchange coupling with the magnetization pinned layer 92 so as to fix the magnetization direction of the magnetization pinned layer 92.

The MR element 90 may be a tunneling magnetoresistive (TMR) element or a giant magnetoresistive (GMR) element of the current-perpendicular-to-plane (CPP) type in which a sense current for use in magnetic signal detection is fed in a direction substantially perpendicular to the plane of the layers constituting the MR element 90. In the TMR element, the gap layer 93 is a tunnel barrier layer. In the GMR element, the gap layer 93 is a nonmagnetic conductive layer.

The MR element 90 varies in resistance value depending on the angle that the direction of the magnetization of the free layer 94 forms with respect to the direction of the magnetization of the magnetization pinned layer 92, and has a minimum resistance value when the foregoing angle is 0° and a maximum resistance value when the foregoing angle is 180°.

In the present embodiment, the magnetization of the magnetization pinned layer 92 is in a direction parallel to the X direction. In the present embodiment, the magnetizations of the magnetization pinned layers 92 of the MR elements 90 in the first resistor section 61 are in the opposite direction to the magnetizations of the magnetization pinned layers 92 of the MR elements 90 in the second resistor section 62. The magnetizations of the magnetization pinned layers 92 of the MR elements 90 in the third resistor section 63 are in the same direction as the magnetizations of the magnetization pinned layers 92 of the MR elements 90 in the first resistor section 61. The magnetizations of the magnetization pinned layers 92 of the MR elements 90 in the fourth resistor section 64 are in the same direction as the magnetizations of the magnetization pinned layers 92 of the MR elements 90 in the second resistor section 62.

In the present embodiment, specifically, the magnetizations of the magnetization pinned layers 92 of the MR elements 90 in the first and third resistor sections 61 and 63 are in the X direction. The magnetizations of the magnetization pinned layers 92 of the MR elements 90 in the second and fourth resistor sections 62 and 64 are in the −X direction.

In the present embodiment, each of the MR elements 90 is elongated in shape in a direction parallel to the Y direction. The free layer 94 of each of the MR elements 90 thus has shape anisotropy such that the direction of the easy axis of magnetization is parallel to the Y direction. When there is no applied magnetic field, the direction of the magnetization of the free layer 94 is thus parallel to the Y direction. In the presence of the output magnetic field component, the direction of the magnetization of the free layer 94 varies depending on the direction and strength of the output magnetic field component. The angle that the direction of the magnetization of the free layer 94 forms with respect to the direction of the magnetization of the magnetization pinned layer 92 thus varies depending on the direction and strength of the output magnetic field component received by each of the MR elements 90. The resistance value of each of the MR elements 90 thus corresponds to the output magnetic field component.

In the present embodiment, the direction of the output magnetic field component received by the MR elements 90 in the second resistor section 62 is the same as the direction of the output magnetic field component received by the MR elements 90 in the first resistor section 61. On the other hand, the direction of the output magnetic field component received by the MR elements 90 in the third resistor section 63 and that of the output magnetic field component received by the MR elements 90 in the fourth resistor section 64 are opposite to the direction of the output magnetic field component received by the MR elements 90 in the first resistor section 61.

It should be appreciated that the configuration of the MR element 90 described above with reference to FIG. 12 is exemplary and non-limiting. For example, the MR element 90 may be configured without the antiferromagnetic layer 91. In such a configuration, for example, a magnetization pinned layer of an artificial antiferromagnetic structure, which includes two ferromagnetic layers and a nonmagnetic metal layer interposed between the two ferromagnetic layers, may be provided in place of the antiferromagnetic layer 91 and the magnetization pinned layer 92.

The shields 71A, 71B, 71C, 71D, 72A, 72B, 72C, and 72D will now be described. The shields 71A, 71B, 71C, 71D, 72A, 72B, 72C, and 72D are each formed of a soft magnetic material.

The shields 71A, 71B, 71C, and 71D are separated from each other and disposed above the magnetic field converter 50 and the magnetic field detector 60. As viewed in a direction parallel to the Z direction, e.g., as viewed from above, the shields 71A, 71B, 71C, and 71D are arranged in this order in the Y direction and overlap the magnetic field converter 50 and the magnetic field detector 60.

The shields 72A, 72B, 72C, and 72D are separated from each other and disposed below the magnetic field converter 50 and the magnetic field detector 60. As viewed in a direction parallel to the Z direction, the shields 72A, 72B, 72C, and 72D are arranged in this order in the Y direction and overlap the magnetic field converter 50 and the magnetic field detector 60.

As viewed in a direction parallel to the Z direction, each of the shields 71A, 71B, 71C, 71D, 72A, 72B, 72C, and 72D has such a shape that its maximum dimension in the Y direction is smaller than its maximum dimension in the X direction. Hereinafter, any one of the shields 71A, 71B, 71C, 71D, 72A, 72B, 72C, and 72D will be referred to as an individual shield 70. The individual shield 70 may be plate-shaped. As viewed in a direction parallel to the Z direction, the individual shield 70 may have a rectangular shape elongated in the X direction.

As viewed in a direction parallel to the Z direction, the shield 71A coincides with the shield 72A, the shield 71B coincides with the shield 72B, the shield 71C coincides with the shield 72C, and the shield 71D coincides with the shield 72D.

As viewed in a direction parallel to the Z direction, as shown in FIGS. 7 to 9, each of the MR elements 90 is located inside the perimeter of any one of the shields 71A, 71B, 71C and 71D and also inside the perimeter of any one of the shields 72A, 72B, 72C and 72D.

When the four MR elements 90 constituting a single train of elements are viewed in a direction parallel to the Z direction, a first one of the four MR elements 90 that lies at the most backward position in the Y direction (the most forward position in the −Y direction) is located inside the perimeter of each of the shields 71A and 72A; a second one of the four MR elements 90 that lies at the second most backward position in the Y direction (the second most forward position in the −Y direction) is located inside the perimeter of each of the shields 71B and 72B; a third one of the four MR elements 90 that lies at the second most forward position in the Y direction (the second most backward position in the −Y direction) is located inside the perimeter of each of the shields 71C and 72C; and the remaining one of the four MR elements 90 lying at the most forward position in the Y direction (the most backward position in the −Y direction) is located inside the perimeter of each of the shields 71D and 72D.

In the present embodiment, as shown in FIG. 8, each yoke 51 includes four shielded portions 51a, 51b, 51c and 51d, and three exposed portions 51e, 51f and 51g.

As viewed in a direction parallel to the Z direction, the shielded portion 51a is located inside the perimeter of each of the shields 71A and 72A; the shielded portion 51b is located inside the perimeter of each of the shields 71B and 72B; the shielded portion 51c is located inside the perimeter of each of the shields 71C and 72C; and the shielded portion 51d is located inside the perimeter of each of the shields 71D and 72D.

None of the exposed portions 51e, 51f, and 51g overlaps any of the individual shields 70 as viewed in a direction parallel to the Z direction. As viewed in a direction parallel to the Z direction, the exposed portion 51e lies between the shields 71A and 71B and between the shields 72A and 72B; the exposed portion 51f lies between the shields 71B and 71C and between the shields 72B and 72C; and the exposed portion 51g lies between the shields 71C and 71D and between the shields 72C and 72D.

Figure 13:
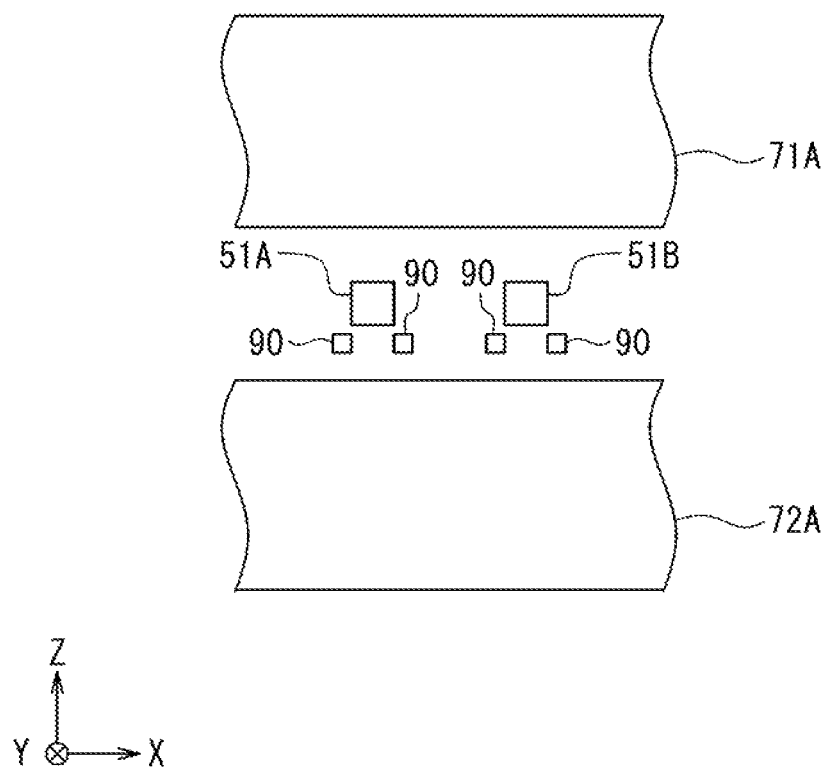
FIG. 13 is a side view of part of the magnetic sensor according to the first embodiment of the invention.

FIG. 13 is a side view of part of the magnetic sensor 30. FIG. 13 shows the shields 71A and 72A, the yokes 51A and 51B, two MR elements 90 near the yoke 51A, and two MR elements 90 near the yoke 51B, as viewed in a direction parallel to the Y direction.

In the present embodiment, the input magnetic field contains the second magnetic field component Hy in addition to the input magnetic field component (the first magnetic field component Hz). The second magnetic field component Hy is a magnetic field component in a direction different from the direction of the input magnetic field component. A main role of the shields 71A, 71B, 71C, 71D, 72A, 72B, 72C, and 72D is to absorb magnetic fluxes corresponding to the second magnetic field component Hy and reduce the strength of a magnetic field in a direction parallel to the Y direction, which results from the second magnetic field component Hy and is applied to the magnetic field detector 60.

The individual shield 70 is formed of a soft magnetic material. An example of the soft magnetic material is NiFe. When employing NiFe to form the individual shield 70, it is preferable to use NiFe having a composition that reduces the coefficient of thermal expansion, more specifically, a composition in which the percentage of Ni is 35% to 60% by weight, so as to reduce thermal stress of the individual shield 70. Further, in consideration of magnetic properties of the individual shield 70, it is more preferable to use NiFe having a composition in which the percentage of Ni is 40% to 60% by weight.

One of performance requirements for the individual shield 70 is a high maximum absorption of magnetic flux. The maximum absorption of magnetic flux of the individual shield 70 is approximately proportional to the product of the saturation magnetization and thickness (dimension in the Z direction) of the individual shield 70. To ensure the performance of the individual shield 70, the product of the saturation magnetization and thickness, i.e., the magnetic moment per unit area of the individual shield 70 is preferably higher than or equal to 0.6 emu/cm$^2$.

Although not illustrated, the magnetic sensor 30 further includes a sensor substrate and an insulating section. The shields 72A, 72B, 72C, and 72D are disposed on the sensor substrate. The insulating section is formed of an insulating material and covers the magnetic field converter 50, the magnetic field detector 60 and the shields 71A, 71B, 71C, 71D, 72A, 72B, 72C, and 72D.

The operations and effects of the magnetic sensor 30 and the magnetic sensor system 101 according to the present embodiment will now be described. The operation of the magnetic field detector 60 will be described first. Assume here that the input magnetic field consists only of the input magnetic field component. When there is no input magnetic field component and, as a result, no output magnetic field component, the direction of the magnetization of the free layer 94 of each MR element 90 is parallel to the Y direction.

When there exists the input magnetic field component in the Z direction, the output magnetic field components received by the MR elements 90 in the first and second resistor sections 61 and 62 are in the X direction, and the output magnetic field components received by the MR elements 90 in the third and fourth resistor sections 63 and 64 are in the −X direction. In such a case, the magnetization direction of the free layers 94 of the MR elements 90 in the first and second resistor sections 61 and 62 tilts toward the X direction from the direction parallel to the Y direction, and the magnetization direction of the free layers 94 of the MR elements 90 in the third and fourth resistor sections 63 and 64 tilts toward the −X direction from the direction parallel to the Y direction. As a result, relative to the state where there is no output magnetic field component, the resistance values of the MR elements 90 in the first and fourth resistor sections 61 and 64 decrease, and the resistance values of the first and fourth resistor sections 61 and 64 also decrease. On the other hand, relative to the state where there is no output magnetic field component, the resistance values of the MR elements 90 in the second and third resistor sections 62 and 63 increase, and the resistance values of the second and third resistor sections 62 and 63 also increase. When the input magnetic field component is in the −Z direction, the direction of the output magnetic field component and the changes in the resistance values of the first to fourth resistor sections 61 to 64 become opposite from those in the above-described case where the input magnetic field component is in the Z direction.

The amount of change in the resistance value of each MR element 90 depends on the strength of the output magnetic field component received by the MR element 90. The resistance value of the MR element 20 increases or decreases by a larger amount as the strength of the output magnetic field component increases. The resistance value of the MR element 20 increases or decreases by a smaller amount as the strength of the output magnetic field component decreases. The strength of the output magnetic field component depends on the strength of the input magnetic field component.

As described above, changes in the direction and strength of the input magnetic field component cause the resistance values of the first to fourth resistor sections 61 to 64 to change such that the resistance values of the first and fourth resistor sections 61 and 64 increase while the resistance values of the second and third resistor sections 62 and 63 decrease, or such that the resistance values of the first and fourth resistor sections 61 and 64 decrease while the resistance values of the second and third resistor sections 62 and 63 increase. This causes a change in the potential difference between the first output port E1 and the second output port E2 shown in FIGS. 9 and 10. The magnetic field detector 60 generates a detection signal dependent on the potential difference between the first output port E1 and the second output port E2. The detection signal depends on the resistance value of the MR element 90. The resistance value of the MR element 90 corresponds to the detection value in the present invention.

Figure 14:
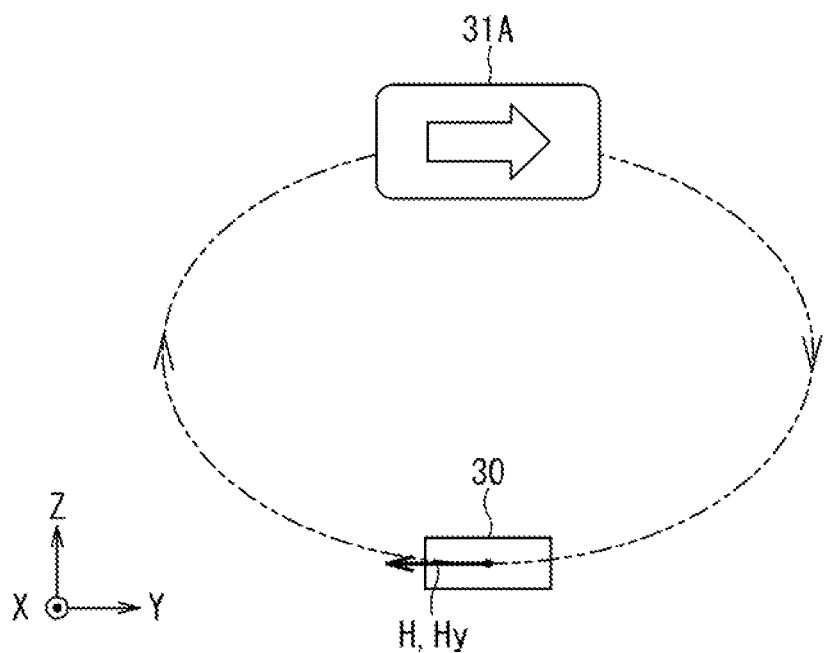
FIG. 14 is an explanatory diagram for describing the relationship between a detection-target position and an input magnetic field in the first embodiment of the invention.
Figure 15:
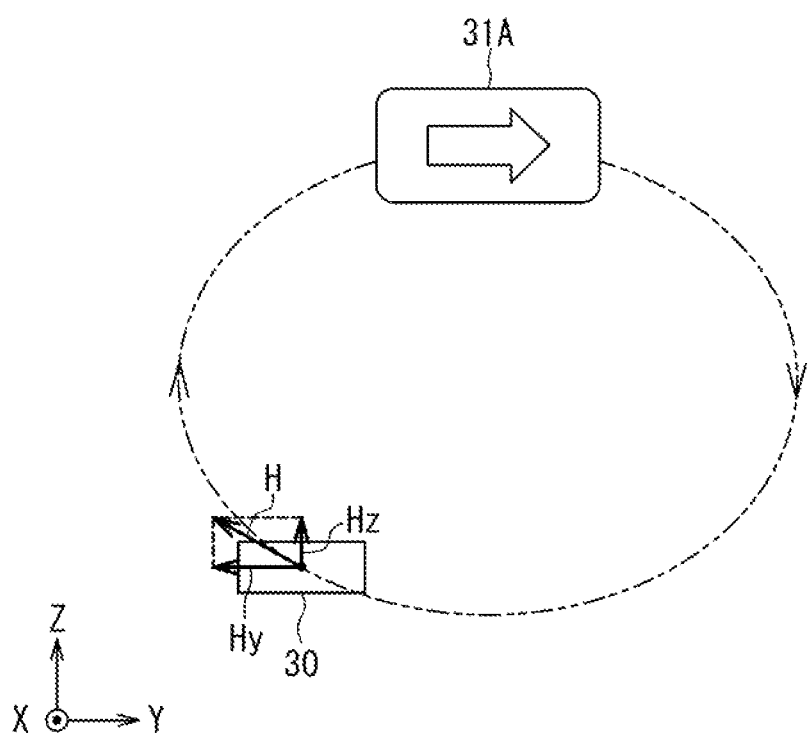
FIG. 15 is an explanatory diagram for describing the relationship between the detection-target position and the input magnetic field in the first embodiment of the invention.
Figure 16:
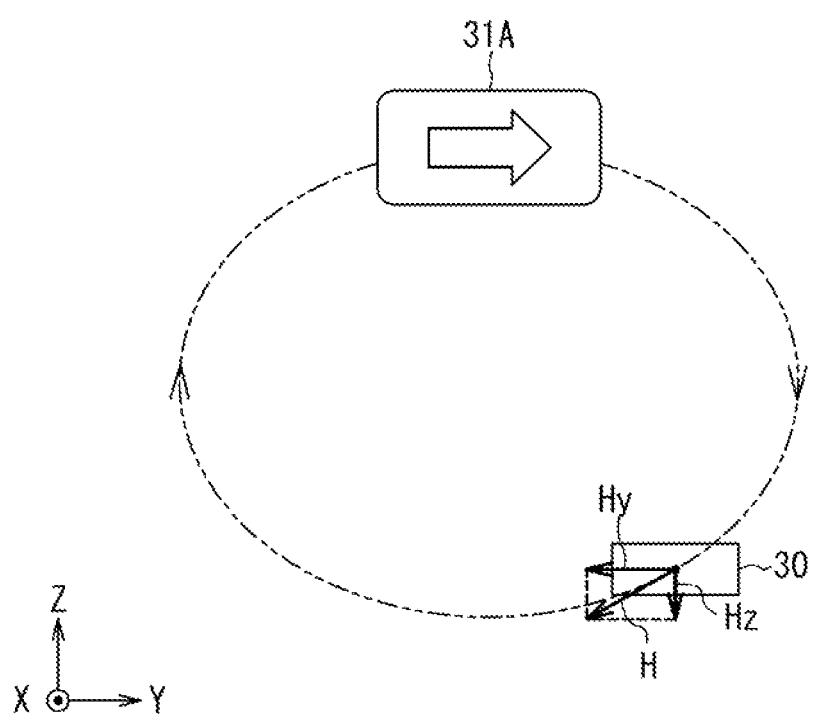
FIG. 16 is an explanatory diagram for describing the relationship between the detection-target position and the input magnetic field in the first embodiment of the invention.

Reference is now made to FIGS. 14 to 16 to describe the relationship between the detection-target position and the input magnetic field. FIGS. 14 to 16 illustrate the relationship between the detection-target position and the input magnetic field. In FIGS. 14 to 16, the arrow H represents the partial magnetic field, i.e., the input magnetic field, applied to the magnetic sensor 30. The arrow Hz represents the first magnetic field component Hz, i.e., the input magnetic field component, and the arrow Hy represents the second magnetic field component Hy.

FIG. 14 shows a state in which the position of the magnet 31A in the Y direction coincides with the position of the magnetic sensor 30 in the Y direction. FIG. 15 shows a state in which the magnet 31A is moved in the Y direction from the position shown in FIG. 14. FIG. 16 shows a state in which the magnet 31A is moved in the −Y direction from the position shown in FIG. 14. The first magnetic field component Hz or the input magnetic field component varies as the detection-target position or the relative position of the magnet 31A with respect to the magnetic sensor 30 in a direction parallel to the Y direction varies as shown in FIGS. 14 to 16.

In the foregoing description of the operation of the magnetic field detector 60, the input magnetic field has been assumed to consist only of the input magnetic field component, i.e., the first magnetic field component Hz. However, in the magnetic sensor system 101 according to the present embodiment, the input magnetic field contains not only the input magnetic field component but also the second magnetic field component Hy, as can be seen from FIGS. 14 to 16.

When the second magnetic field component Hy is applied to the magnetic field detector 60, the free layer 94 of each MR element 90 is subjected not only to the output magnetic field component in a direction parallel to the X direction but also to the second magnetic field component Hy in a direction parallel to the Y direction. In such a case, the angle formed by the magnetization direction of the free layer 94 with respect to the magnetization direction of the magnetization pinned layer 92 becomes different from that in the case where the input magnetic field consists only of the input magnetic field component. As a result, the resistance value of the MR element 90 and the detection signal of the magnetic field detector 60 also become different from those in the case where the input magnetic field consists only of the input magnetic field component. The second magnetic field component Hy can thus result in an error in the detection signal of the magnetic field detector 60 and a drop in the sensitivity of the magnetic field detector 60.

According to the present embodiment, the shields 71A, 71B, 71C, 71D, 72A, 72B, 72C, and 72D absorb magnetic flux corresponding to the second magnetic field component Hy to reduce the strength of a magnetic field in a direction parallel to the Y direction that will be applied to the magnetic field detector 60 due to the second magnetic field component Hy.

In this way, according to the present embodiment, it is possible to prevent the occurrence of problems in the case where the input magnetic field applied to the magnetic sensor 30 contains not only the input magnetic field component but also the second magnetic field component Hy, which is a magnetic field component in a direction different from the direction of the input magnetic field component.

Now, a description will be given of a first feature of the present embodiment and a first effect produced by the first feature. The first feature is related to the shapes and arrangement of the yokes 51 and the shields 71A, 71B, 71C, 71D, 72A, 72B, 72C, and 72D.

Figure 17:
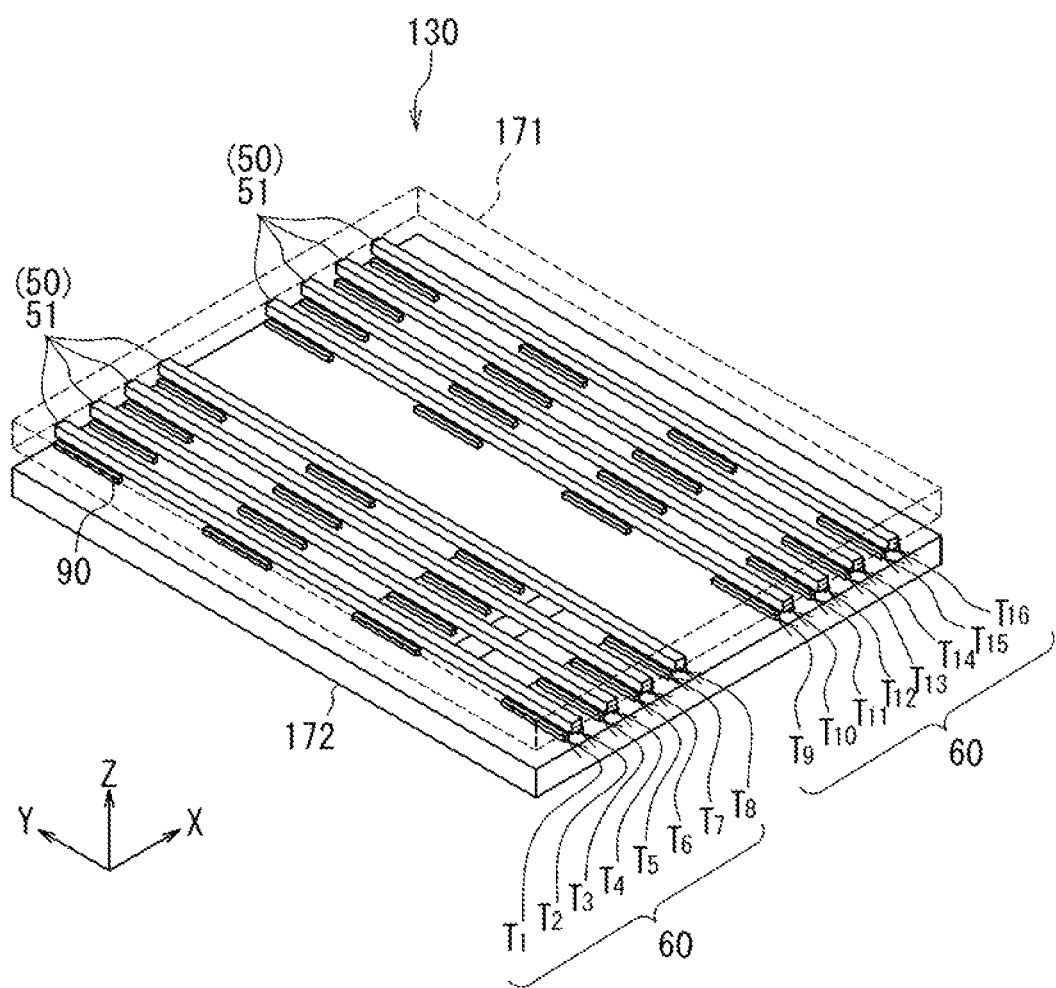
FIG. 17 is a perspective view of a magnetic sensor of a comparative example.

Prior to describing the first effect, a magnetic sensor 130 of a comparative example will be described. FIG. 17 is a perspective view of the magnetic sensor 130 of the comparative example. The magnetic sensor 130 of the comparative example has a single shield 171 in place of the shields 71A, 71B, 71C and 71D of the present embodiment, and a single shield 172 in place of the shields 72A, 72B, 72C and 72D of the present embodiment. The shield 171 is disposed above the magnetic field converter 50 and the magnetic field detector 60. The shield 172 is disposed below the magnetic field converter 50 and the magnetic field detector 60. Each of the shields 171 and 172 overlaps the magnetic field converter 50 and the magnetic field detector 60 as viewed in a direction parallel to the Z direction. As viewed in a direction parallel to the Z direction, each of the shields 171 and 172 has such a shape that its maximum dimension in the Y direction is greater than its maximum dimension in the X direction. In other words, the longitudinal direction of each of the shields 171 and 172 is parallel to the Y direction. The configuration of the magnetic sensor 130 of the comparative example is otherwise the same as that of the magnetic sensor 30 according to the present embodiment.

Next, a problem of the magnetic sensor 130 of the comparative example will be described. Suppose here that the magnetic sensor 130 of the comparative example is placed in such an orientation that the longitudinal direction of the shields 171 and 172 and the longitudinal direction of the yokes 51 are parallel to the X direction. In this case, the direction of the second magnetic field component Hy is orthogonal to the longitudinal direction of the yokes 51 and the longitudinal direction of the trains of elements. Furthermore, the magnetic flux corresponding to the second magnetic field component Hy curves largely near inflow ends of the shields 171 and 172 where the magnetic flux corresponding to the second magnetic field component Hy flows in and near outflow ends of the shields 171 and 172 where the magnetic flux corresponding to the second magnetic field component Hy flows out. Moreover, the direction of the magnetic flux corresponding to the second magnetic field component Hy near the inflow ends differs greatly from the direction thereof near the outflow ends. Accordingly, the effects of the second magnetic field component Hy on the trains of elements vary depending on the positions of the trains of elements. This consequently causes an error in the detection signal of the magnetic field detector 60.

Next, suppose that the magnetic sensor 130 of the comparative example is placed in such an orientation that the longitudinal direction of the shields 171 and 172 and the longitudinal direction of the yokes 51 are parallel to the Y direction as shown in FIG. 17. In this case, the effects of the second magnetic field component Hy on the MR elements 90 in a single train of elements can vary depending on the positions of the MR elements 90. Even in such a case, however, it is possible to cancel out the effects of the second magnetic field component Hy exerted on a plurality of MR elements 90 in a single train of elements. Accordingly, it is possible to reduce the error occurring in the detection signal of the magnetic field detector 60.

However, placing the magnetic sensor 130 of the comparative example as shown in FIG. 17 causes the dimension of the shields 171 and 172 in the direction of the second magnetic field component Hy to be greater than in the case where the shields 171 and 172 are oriented such that their longitudinal direction is parallel to the X direction. This reduces a demagnetizing field against the second magnetic field component Hy in each of the shields 171 and 172. As a result, the capacity of the shields 171 and 172 to absorb the second magnetic field component Hy decreases.

The first feature of the present embodiment is as follows. In the present embodiment, as viewed in a direction parallel to the Z direction, the shields 71A, 71B, 71C, and 71D separated from each other are aligned in the Y direction, and the shields 72A, 72B, 72C and 72D separated from each other are aligned in the Y direction. As viewed in a direction parallel to the Z direction, each of the shields 71A, 71B, 71C, 71D, 72A, 72B, 72C and 72D has such a shape that its maximum dimension in the Y direction is smaller than its maximum dimension in the X direction.

The first feature of the present embodiment provides the following first effect. According to the present embodiment, the demagnetizing field against the second magnetic field component Hy increases in the individual shields 70. This enables enhancement of the capacity of the individual shields 70 to absorb the second magnetic field component Hy. The present embodiment thus makes it possible to prevent the occurrence of an error in the detection signal of the magnetic sensor 30 and a drop in the sensitivity of the magnetic sensor 30 due to the second magnetic field component Hy.

When the magnetic field detector 60 includes a plurality of MR elements 90, any attempts to provide two shields as in the magnetic sensor 130 of the comparative example may result in the necessity that each of the two shield be shaped such that its maximum dimension in the Y direction is greater than its maximum dimension in the X direction as viewed in a direction parallel to the Z direction, for reasons of layout of the plurality of MR elements 90. Even in such a case, according to the present embodiment, each of the individual shields 70 can have such a shape that its maximum dimension in the Y direction is smaller than its maximum dimension in the X direction as viewed in a direction parallel to the Z direction.

The first effect will be described in further detail with reference to simulation results after the description of a third embodiment.

A second feature of the present embodiment and a second effect produced by the second feature will now be described. The second feature is that each of the MR elements 90 is located inside the perimeter of any one of the shields 71A, 71B, 71C and 71D and also inside the perimeter of any one of the shields 72A, 72B, 72C and 72D, as viewed in a direction parallel to the Z direction.

Before describing the second effect, a description will be given of a magnetic hysteresis of the yokes 51 with respect to a magnetic field applied to the magnetic sensor 30 in a direction parallel to the Z direction and a resulting hysteresis of the detection signal of the magnetic field detector 60. Hereinafter, the magnetic hysteresis of the yokes 51 with respect to the magnetic field applied to the magnetic sensor 30 in a direction parallel to the Z direction will be referred to simply as the magnetic hysteresis of the yokes 51. The strength of the magnetic field applied in the −Z direction will be expressed in a negative value. The strength of the magnetic field applied in the Z direction will be expressed in a positive value. The magnetic hysteresis of the yokes 51 refers to a phenomenon in which the magnetization of the yokes 51 when the strength of the applied magnetic field has a predetermined value varies depending on the history of the applied magnetic field, i.e., whether the strength of the applied magnetic field has increased to reach the predetermined value or decreased to reach the predetermined value.

The hysteresis of the detection signal refers to a phenomenon in which the value of the detection signal when the strength of the applied magnetic field has a predetermined value varies depending on the history of the applied magnetic field, i.e., whether the strength of the applied magnetic field has increased to reach the predetermined value or decreased to reach the predetermined value.

In the present embodiment, each yoke 51 includes the shielded portions 51a, 51b, 51c and 51d, and the exposed portions 51e, 51f and 51g. The magnetic hysteresis of each of these portions will be discussed below.

Figure 18:
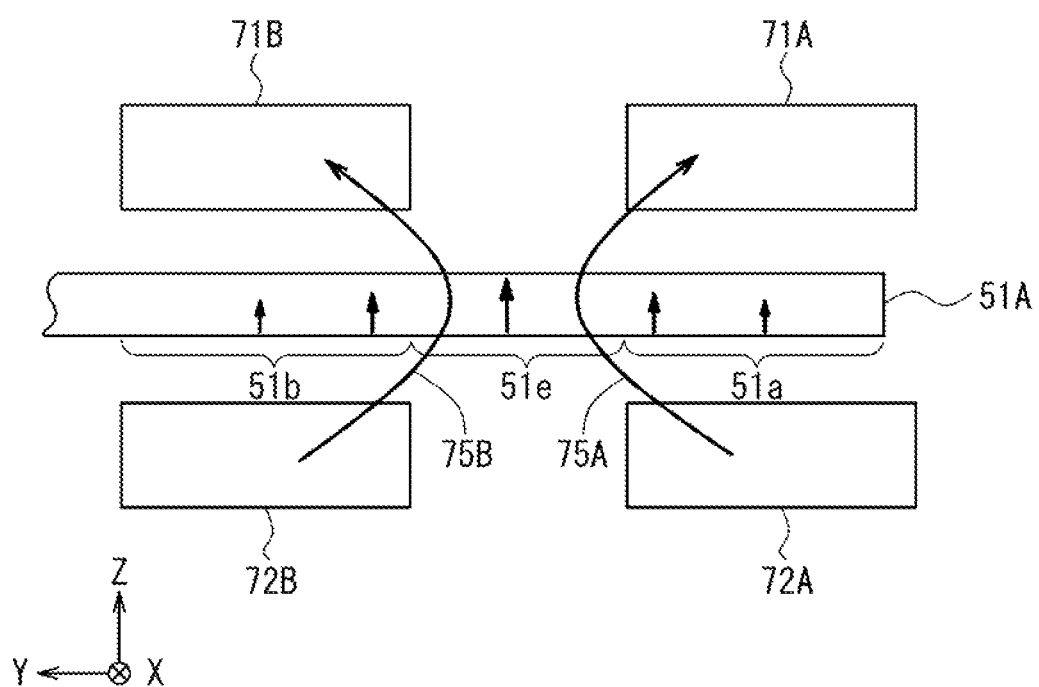
FIG. 18 is an explanatory diagram illustrating a second effect of the magnetic sensor according to the first embodiment of the invention.

FIG. 18 illustrates the shields 71A, 71B, 72A and 72B, and the shielded portions 51a and 51b and the exposed portion 51e of the yoke 51A. In FIG. 18, the symbol 75A represents part of a magnetic flux that passes through the shield 72A and the shield 71A when the applied magnetic field is in the Z direction, and the symbol 75B represents part of a magnetic flux that passes through the shield 72B and the shield 71B when the applied magnetic field is in the Z direction. The arrows drawn inside the yoke 51A each indicate the direction and magnitude of the magnetization at the position of the arrow.

As shown in FIG. 18, the part of the magnetic flux passing though the shields 72A and 71A curves and passes through the exposed portion 51e. The part of the magnetic flux passing through the shields 72B and 71B also curves and passes through the exposed portion 51e. Accordingly, if the strength of the applied magnetic field has a value other than 0, the magnetization at the exposed portion 51e becomes higher than that at each of the shielded portions 51a and 51b. As for an entire yoke 51, if the strength of the applied magnetic field has a value other than 0, the magnetization at each of the exposed portions 51e, 51f and 51g becomes higher than that at each of the shielded portions 51a, 51b, 51c and 51d. As a result, the exposed portions 51e, 51f, and 51g each exhibit a more pronounced magnetic hysteresis, compared to each of the shielded portions 51a, 51b, 51c and 51d.

Supposing the magnetic sensor 30 lacks the second feature, at least one of the plurality of MR elements 90 will be located near any one of the exposed portions 51e, 51f and 51g. This may cause the hysteresis of the detection signal to become pronounced to increase the error in the detection signal.

On the contrary, in the magnetic sensor 30 according to the present embodiment, all the plurality of MR elements 90 are located near any one of the shielded portions 51a, 51b, 51c and 51d, not near any of the exposed portions 51e, 51f and 51g, because of the second feature. The present embodiment thus makes it possible to reduce error in the detection signal attributable to the hysteresis of the detection signal. This is the second effect of the present embodiment.

The description so far has dealt with the magnetic sensor 30 disposed on the inner side of the coil 41 (see FIG. 1) and the magnetic sensor system 101 including this magnetic sensor 30. The magnetic sensor 30 and the magnetic sensor system 101 described above will hereinafter be referred to as a magnetic sensor and a magnetic sensor system of a first example.

For the camera module 100 shown in FIGS. 1 to 3, not only the magnetic sensor and the magnetic sensor system of the first example but also the magnetic sensor 30 disposed on the inner side of the coil 44 (see FIG. 1) and a magnetic sensor system including this magnetic sensor 30 can be the magnetic sensor and the magnetic sensor system according to the present embodiment. The magnetic sensor 30 disposed on the inner side of the coil 44 and the magnetic sensor system including this magnetic sensor 30 will hereinafter be referred to as a magnetic sensor and a magnetic sensor system of a second example.

The magnetic sensor and the magnetic sensor system of the second example are basically the same in configuration as the magnetic sensor and the magnetic sensor system of the first example. In the second example, however, the X direction corresponds to the second direction in the present invention, and the Y direction corresponds to the third direction in the present invention. The foregoing description of the first example thus applies to the second example if the magnet 31A, the X direction, and the Y direction in the description are replaced with the magnet 34A, the Y direction, and the X direction, respectively. The magnetic sensor system of the second example is a position detection device for detecting the relative position of the magnet 34A with respect to the magnetic sensor 30 in a direction parallel to the X direction.

Second Embodiment

Figure 19:
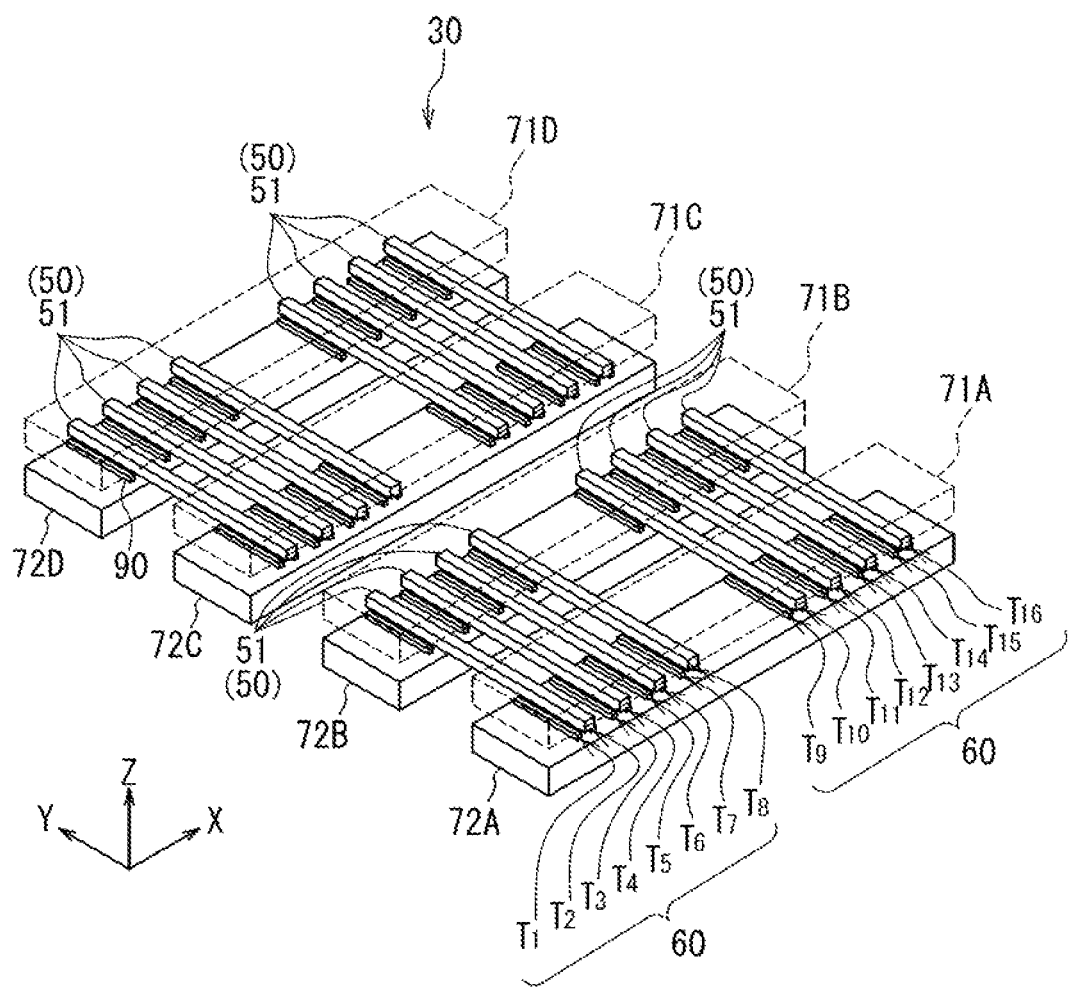
FIG. 19 is a perspective view of a magnetic sensor according to a second embodiment of the invention.
Figure 20:
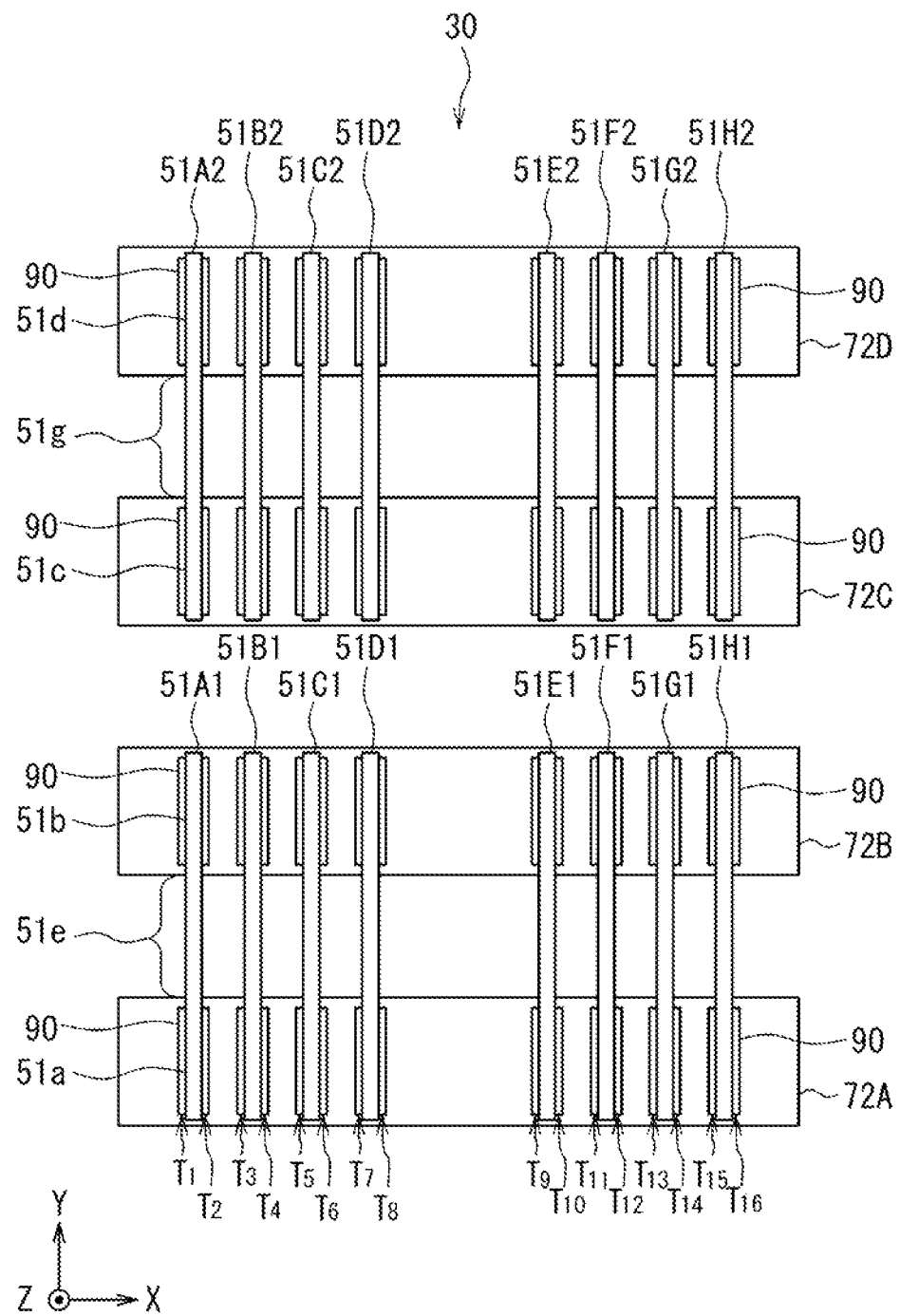
FIG. 20 is a plan view of the magnetic sensor according to the second embodiment of the invention.

A second embodiment of the invention will now be described. FIG. 19 is a perspective view of a magnetic sensor according to the second embodiment. FIG. 20 is a plan view of the magnetic sensor according to the second embodiment. FIG. 20 omits the illustration of the shields 71A, 71B, 71C, and 71D.

The magnetic sensor 30 according to the present embodiment differs from the magnetic sensor 30 according to the first embodiment in the following ways. In the present embodiment, the magnetic field converter 50 includes sixteen yokes 51 instead of the eight yokes 51 of the first embodiment. The sixteen yokes 51 will hereinafter be distinguished from each other using reference symbols 51A1, 51A2, 51B1, 51B2, 51C1, 51C2, 51D1, 51D2, 51E1, 51E2, 51F1, 51F2, 51G1, 51G2, 51H1, and 51H2.

The yokes 51A1 and 51A2 substitute for the yoke 51A of the first embodiment. The yokes 51B1 and 51B2 substitute for the yoke 51B of the first embodiment. The yokes 51C1 and 51C2 substitute for the yoke 51C of the first embodiment. The yokes 51D1 and 51D2 substitute for the yoke 51D of the first embodiment. The yokes 51E1 and 51E2 substitute for the yoke 51E of the first embodiment. The yokes 51F1 and 51F2 substitute for the yoke 51F of the first embodiment. The yokes 51G1 and 51G2 substitute for the yoke 51G of the first embodiment. The yokes 51H1 and 51H2 substitute for the yoke 51H of the first embodiment.

A pair of yokes that substitutes for one yoke 51 of the first embodiment will be referred to as a train of yokes. The two yokes constituting one train of yokes are separated from each other and aligned in the Y direction. The two yokes constituting one train of yokes correspond to two portions of one yoke 51 of the first embodiment obtained by removing the exposed portion 51f from the yoke 51. In the present embodiment, two trains of elements are associated with one train of yokes.

Each of the yokes 51A1, 51B1, 51C1, 51D1, 51E1, 51F1, 51G1, and 51H1 includes the two shielded portions 51a and 51b and the exposed portion 51e described in relation to the first embodiment. Each of the yokes 51A2, 51B2, 51C2, 51D2, 51E2, 51F2, 51G2, and 51H2 includes the two shielded portions 51c and 51d and the exposed portion 51g described in relation to the first embodiment.

In the present embodiment, each of the sixteen yokes 51 has a rectangular parallelepiped shape elongated in the Y direction, for example. The sixteen yokes 51 are identical in shape.

The configuration, operation and effects of the present embodiment are otherwise the same as those of the first embodiment.

Third Embodiment

Figure 21:
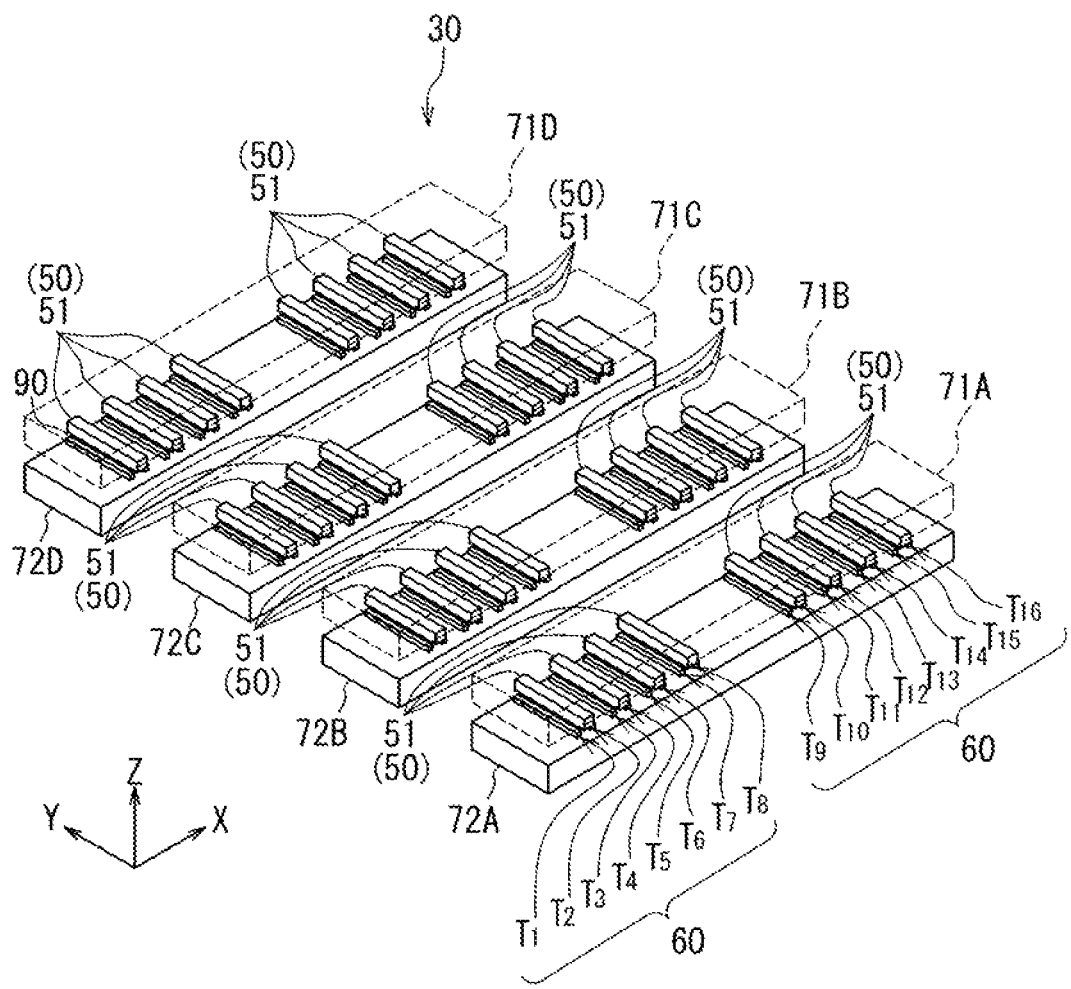
FIG. 21 is a perspective view of a magnetic sensor according to a third embodiment of the invention.
Figure 22:
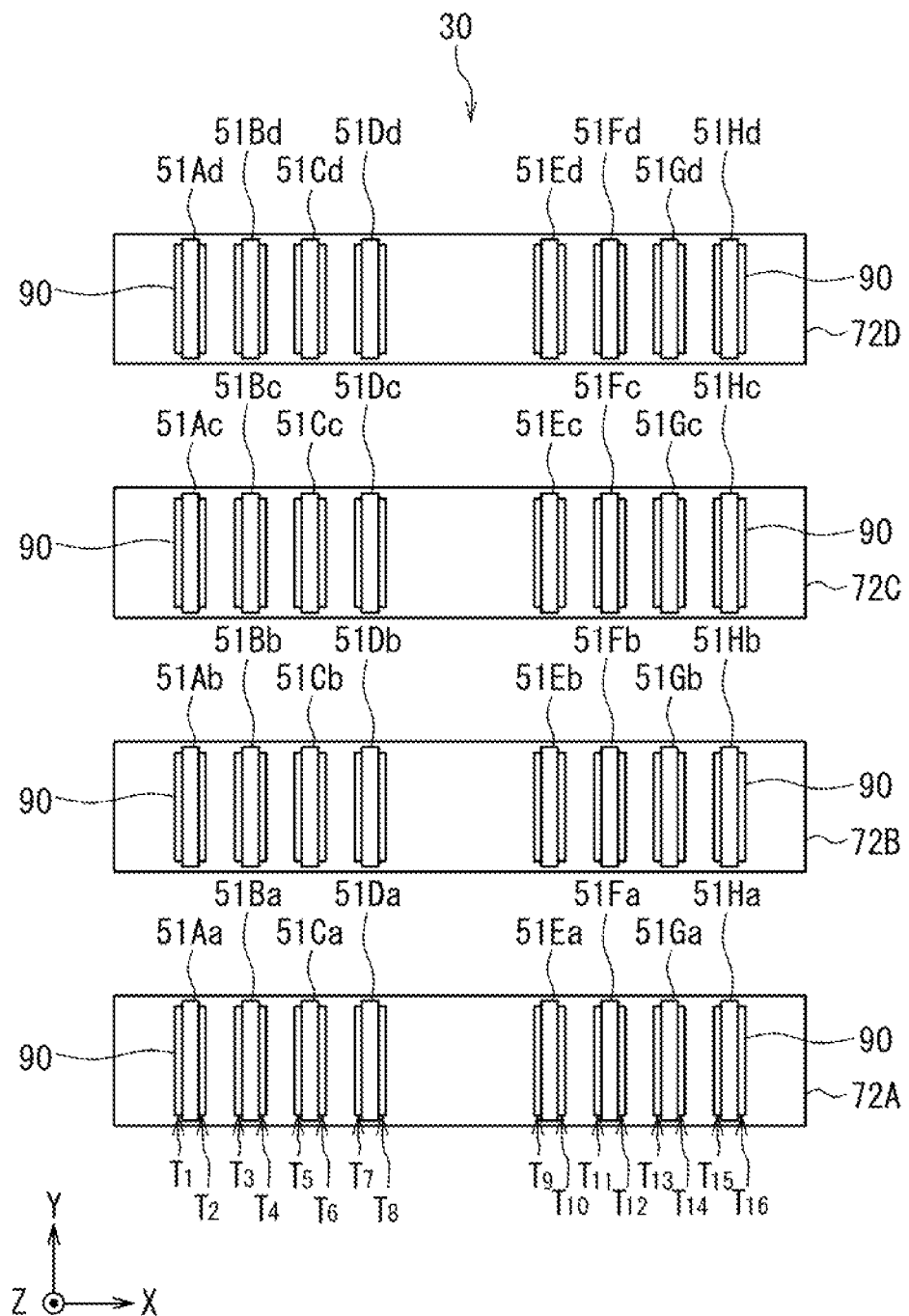
FIG. 22 is a plan view of the magnetic sensor according to the third embodiment of the invention.

A third embodiment of the invention will now be described. FIG. 21 is a perspective view of a magnetic sensor according to the third embodiment. FIG. 22 is a plan view of the magnetic sensor according to the third embodiment. FIG. 22 omits the illustration of the shields 71A, 71B, 71C, and 71D.

The magnetic sensor 30 according to the present embodiment differs from the magnetic sensor 30 according to the first embodiment in the following ways. In the present embodiment, the magnetic field converter 50 includes thirty-two yokes 51 instead of the eight yokes 51 of the first embodiment. The thirty-two yokes 51 will hereinafter be distinguished from each other using reference symbols 51Aa, 51Ab, 51Ac, 51Ad, 51Ba, 51Bb, 51Bc, 51Bd, 51Ca, 51Cb, 51Cc, 51Cd, 51Da, 51Db, 51Dc, 51Dd, 51Ea, 51Eb, 51Ec, 51Ed, 51Fa, 51Fb, 51Fc, 51Fd, 51Ga, 51Gb, 51Gc, 51Gd, 51Ha, 51Hb, 51Hc, and 51Hd.

The yokes 51Aa, 51Ab, 51Ac, and 51Ad substitute for the yoke 51A of the first embodiment. The yokes 51Ba, 51Bb, 51Bc, and 51Bd substitute for the yoke 51B of the first embodiment. The yokes 51Ca, 51Cb, 51Cc, and 51Cd substitute for the yoke 51C of the first embodiment. The yokes 51Da, 51Db, 51Dc, 51Dd substitute for the yoke 51D of the first embodiment. The yokes 51Ea, 51Eb, 51Ec, and 51Ed substitute for the yoke 51E of the first embodiment. The yokes 51Fa, 51Fb, 51Fc, 51Fd substitute for the yoke 51F of the first embodiment. The yokes 51Ga, 51Gb, 51Gc, 51Gd substitute for the yoke 51G of the first embodiment. The yokes 51Ha, 51Hb, 51Hc, and 51Hd substitute for the yoke 51H of the first embodiment.

A group of four yokes that substitutes for one yoke 51 of the first embodiment will be referred to as a train of yokes. The four yokes constituting one train of yokes are separated from each other and aligned in the Y direction. The four yokes constituting one train of yokes correspond to four portions of one yoke 51 of the first embodiment obtained by removing the three exposed portions 51e, 51f and 51g from the yoke 51. In the present embodiment, two trains of elements are associated with one train of yokes.

The yokes 51Aa, 51Ba, 51Ca, 51Da, 51Ea, 51Fa, 51Ga, and 51Ha are located inside the perimeter of each of the shields 71A and 72A as viewed in a direction parallel to the Z direction. The yokes 51Ab, 51Bb, 51Cb, 51Db, 51Eb, 51Fb, 51Gb, and 51Hb are located inside the perimeter of each of the shields 71B and 72B as viewed in a direction parallel to the Z direction. The yokes 51Ac, 51Bc, 51Cc, 51Dc, 51Ec, 51Fc, 51Gc, and 51Hc are located inside the perimeter of each of the shields 71C and 72C as viewed in a direction parallel to the Z direction. The yokes 51Ad, 51Bd, 51Cd, 51Dd, 51Ed, 51Fd, 51Gd, and 51Hd are located inside the perimeter of each of the shields 71D and 72D as viewed in a direction parallel to the Z direction.

In the present embodiment, each of the thirty-two yokes 51 has a rectangular parallelepiped shape elongated in the Y direction, for example. The thirty-two yokes 51 are identical in shape.

The magnetic sensor 30 according to the present embodiment has the first and second features as with the first embodiment. The magnetic sensor 30 according to the present embodiment further has a third feature. The third feature is that each of the thirty-two yokes 51 is located inside the perimeter of any one of the shields 71A, 71B, 71C and 71D and also inside the perimeter of any one of the shields 72A, 72B, 72C and 72D, as viewed in a direction parallel to the Z direction.

According to the present embodiment, the second effect described in relation to the first embodiment is exhibited more effectively by virtue of the addition of the third feature to the second feature. The reasons for this will be described with reference to FIG. 18. As has been described in relation to the first embodiment, if the strength of the applied magnetic field has a value other than 0, the magnetization at the exposed portion 51e of the yoke 51A in FIG. 18 becomes higher than that at each of the shielded portions 51a and 51b. Due to the effect of the magnetization at the exposed portion 51e, the magnetization at each of the shielded portions 51a and 51b becomes higher than when there is no exposed portion 51e. Consequently, it is harder for the magnetization at each of the shielded portions 51a and 51b to change smoothly in response to a change in the applied magnetic field, compared to when there is no exposed portion 51e. As a result, a magnetic hysteresis occurs also at each of the shielded portions 51a and 51b. In such a manner, in the yokes 51 of the first embodiment, a magnetic hysteresis occurs also at each of the shielded portions 51a, 51b, 51c, and 51d.

In the present embodiment, because of the third feature, the yokes 51 include no portions corresponding to the exposed portions 51e, 51f and 51g. The second effect is thus more effectively exhibited according to the present embodiment.

The configuration, operation and effects of the present embodiment are otherwise the same as those of the first embodiment.

Simulation Results

Now, with reference to the following simulation results, a further detailed description will be given of the first effect described in relation to the first embodiment.

In the simulation, the capacities of a plurality of shields to absorb the second magnetic field component Hy were compared between first to third models. The plurality of shields in the first to third models are formed of NiFe of the same composition.

Figure 23:
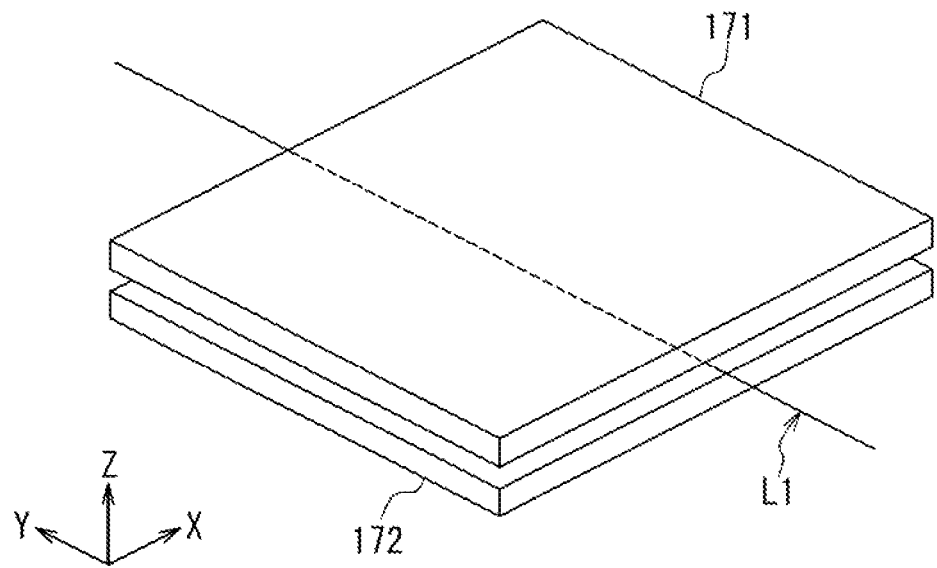
FIG. 23 is a perspective view of a first model for a simulation.

FIG. 23 is a perspective view of the first model. As shown in FIG. 23, the first model has shields 171 and 172. The shields 171 and 172 of the first model respectively correspond to the shields 171 and 172 of the magnetic sensor 130 of the comparative example shown in FIG. 17. The shields 171 and 172 of the first model have the same rectangular parallelepiped shape. Each of the shields 171 and 172 has dimensions in the X, Y, and Z directions of 135 μm, 120 μm, and 7 μm, respectively. The shield 172 lies below the shield 171, being 5 μm spaced apart from the shield 171.

Assume here a first straight line L1 extending in the Y direction as shown in FIG. 23. The first straight line L1 includes a line segment that is located at the center in the Z and X directions of the space between the shields 171 and 172.

Any point located on the first straight line L1 will be referred to as a first measurement position. The center point of the aforementioned line segment will be referred to as a first point of origin. The first measurement position is represented by a value whose absolute value is the distance from the first point of origin. The first measurement position is expressed in a negative value if located forward of the first point of origin in the −Y direction, and in a positive value if located forward of the first point of origin in the Y direction.

In the simulation, the first model was subjected to the second magnetic field component Hy of varied strengths to determine the relationship between the first measurement position and a first magnetic flux passing rate. The first magnetic flux passing rate refers to the ratio of the value of the magnetic flux density at the first measurement position to the value of a magnetic flux density By that corresponds to the second magnetic field component Hy.

Figure 24:
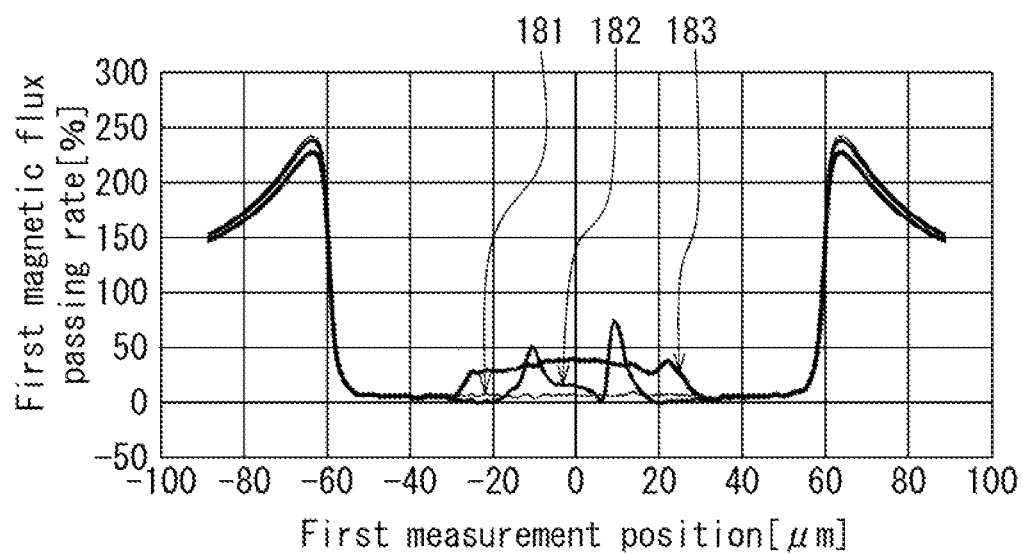
FIG. 24 is a characteristic diagram illustrating part of the simulation results on the first model.

FIG. 24 illustrates part of the simulation results on the first model. In FIG. 24 the horizontal axis represents the first measurement position, and the vertical axis represents the first magnetic flux passing rate. In FIG. 24 the curves labeled 181, 182, and 183 represent the relationship between the first measurement position and the first magnetic flux passing rate when the magnetic flux density By had a value of 100 mT, 120 mT, and 140 mT, respectively.

Figure 25:
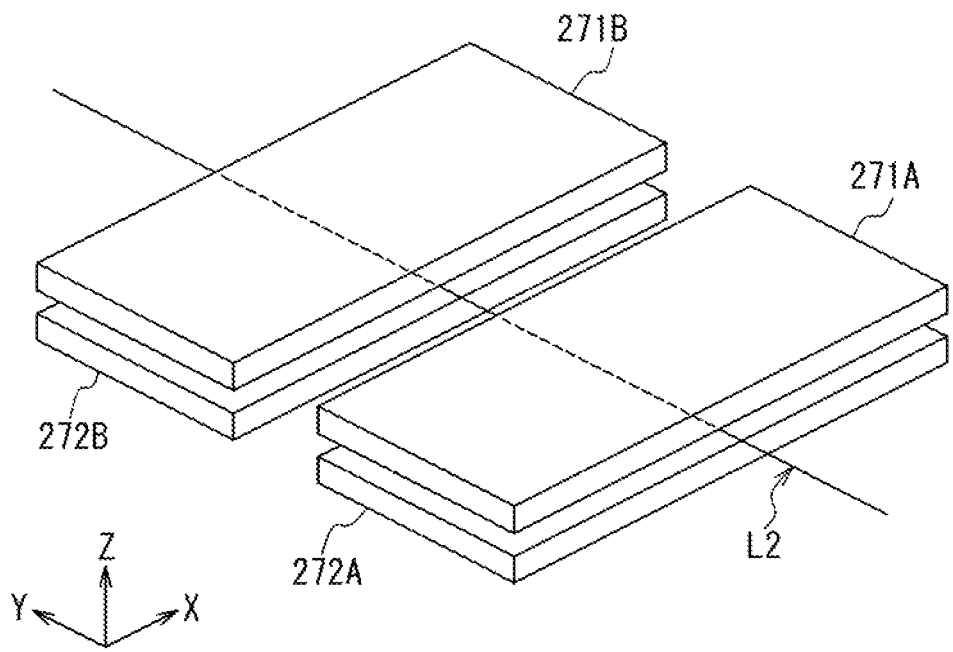
FIG. 25 is a perspective view of a second model for the simulation.

FIG. 25 is a perspective view of the second model. As shown in FIG. 25, the second model has shields 271A and 271B in place of the shield 171 of the first model, and also shields 272A and 272B in place of the shield 172 of the first model. The shields 271A, 271B, 272A, and 272B have the same rectangular parallelepiped shape. Each of the shields 271A, 271B, 272A, and 272B has dimensions in the X, Y, and Z directions of 135 µm, 60 µm, and 7 µm, respectively.

The shield 271B is located forward of the shield 271A in the Y direction, being 27 µm spaced apart from the shield 271A. The shield 272B is located forward of the shield 272A in the Y direction, being 27 µm spaced apart from the shield 272A. The shield 272A lies below the shield 271A, being 5 µm spaced apart from the shield 271A. The shield 272B lies below the shield 271B, being 5 µm spaced apart from the shield 271B.

Assume here a second straight line L2 extending in the Y direction as shown in FIG. 25. The second straight line L2 includes a first line segment located at the center in the Z and X directions of the space between the shields 271A and 272A, and a second line segment located at the center in the Z and X directions of the space between the shields 271B and 272B.

Any point located on the second straight line L2 will be referred to as a second measurement position. The center point between the first and second line segments on the second straight line L2 will be referred to as a second point of origin. The second measurement position is represented by a value whose absolute value is the distance from the second point of origin. The second measurement position is expressed in a negative value if located forward of the second point of origin in the −Y direction, and in a positive value if located forward of the second point of origin in the Y direction.

In the simulation, the second model was subjected to the second magnetic field component Hy of varied strengths to determine the relationship between the second measurement position and a second magnetic flux passing rate. The second magnetic flux passing rate refers to the ratio of the value of the magnetic flux density at the second measurement position to the value of the magnetic flux density By corresponding to the second magnetic field component Hy.

Figure 26:
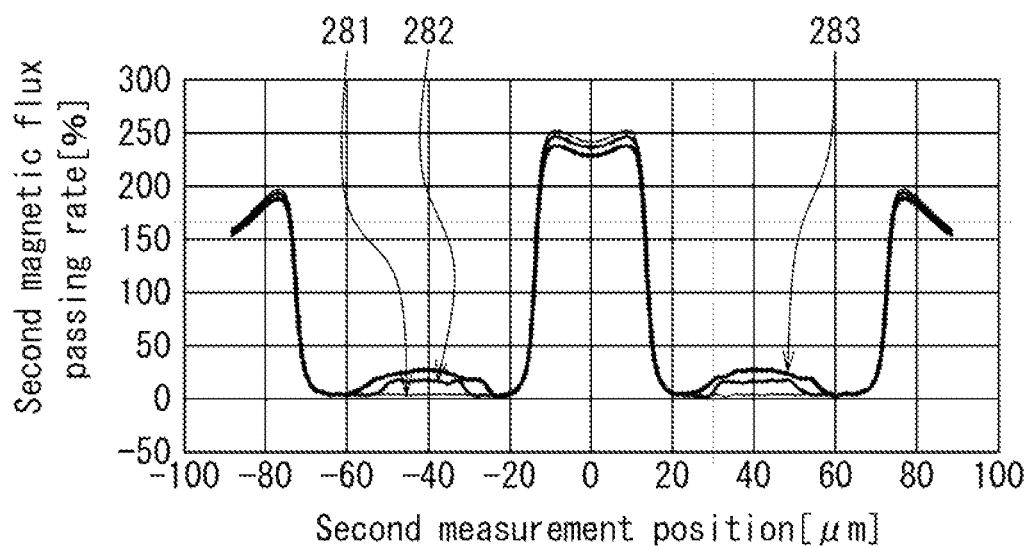
FIG. 26 is a characteristic diagram illustrating part of the simulation results on the second model.

FIG. 26 illustrates part of the simulation results on the second model. In FIG. 26 the horizontal axis represents the second measurement position, and the vertical axis represents the second magnetic flux passing rate. In FIG. 26 the curves labeled 281, 282, and 283 represent the relationship between the second measurement position and the second magnetic flux passing rate when the magnetic flux density By had a value of 180 mT, 200 mT, and 220 mT, respectively.

Figure 27:
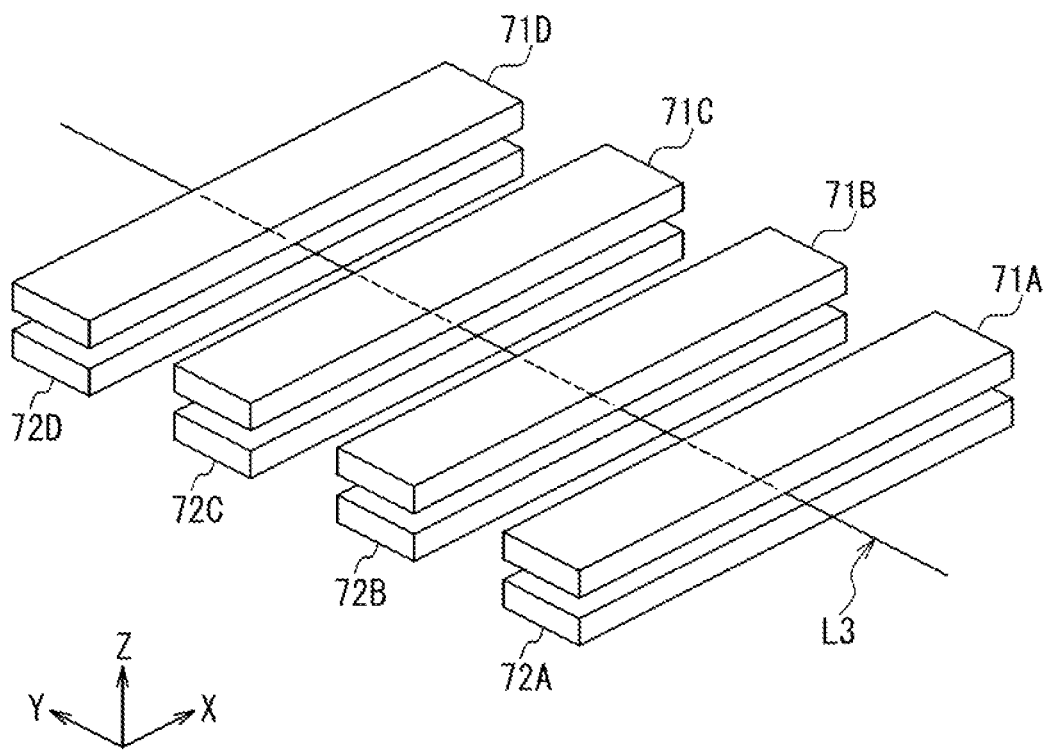
FIG. 27 is a perspective view of a third model for the simulation.

FIG. 27 is a perspective view of the third model. As shown in FIG. 27, the third model has shields 71A, 71B, 71C and 71D in place of the shield 171 of the first model, and also shields 72A, 72B, 72C and 72D in place of the shield 172 of the first model. The shields 71A, 71B, 71C, 71D, 72A, 72B, 72C, and 72D of the third model respectively correspond to the shields 71A, 71B, 71C, 71D, 72A, 72B, 72C, and 72D of the first to third embodiments. The shields 71A, 71B, 71C, 71D, 72A, 72B, 72C, and 72D of the third model have the same rectangular parallelepiped shape. Each of the shields 71A, 71B, 71C, 71D, 72A, 72B, 72C, and 72D has dimensions in the X, Y, and Z directions of 135 µm, 25 µm, and 7 µm, respectively.

As viewed in a direction parallel to the Z direction, the shields 71A, 71B, 71C, and 71D are arranged in this order in the Y direction, and the shields 72A, 72B, 72C, and 72D are arranged in this order in the Y direction. The distance between two of the shields adjacent in the Y direction is 27 µm. The shields 72A, 72B, 72C, and 72D are respectively located below the shields 71A, 71B, 71C, and 71D, being 5 µm spaced apart therefrom.

Assume here a third straight line L3 extending in the Y direction as shown in FIG. 27. The third straight line L3 includes a first line segment located at the center in the Z and X directions of the space between the shields 71A and 72A, a second line segment located at the center in the Z and X directions of the space between the shields 71B and 72B, a third line segment located at the center in the Z and X directions of the space between the shields 71C and 72C, and a fourth line segment located at the center in the Z and X directions of the space between the shields 71D and 72D.

Any point located on the third straight line L3 will be referred to as a third measurement position. The center point between the second and third line segments on the third straight line L3 will be referred to as a third point of origin. The third measurement position is represented by a value whose absolute value is the distance from the third point of origin. The third measurement position is expressed in a negative value if located forward of the third point of origin in the −Y direction, and in a positive value if located forward of the third point of origin in the Y direction.

In the simulation, the third model was subjected to the second magnetic field component Hy of varied strengths to determine the relationship between the third measurement position and a third magnetic flux passing rate. The third magnetic flux passing rate refers to the ratio of the value of the magnetic flux density at the third measurement position to the value of the magnetic flux density By corresponding to the third magnetic field component Hy.

Figure 28:
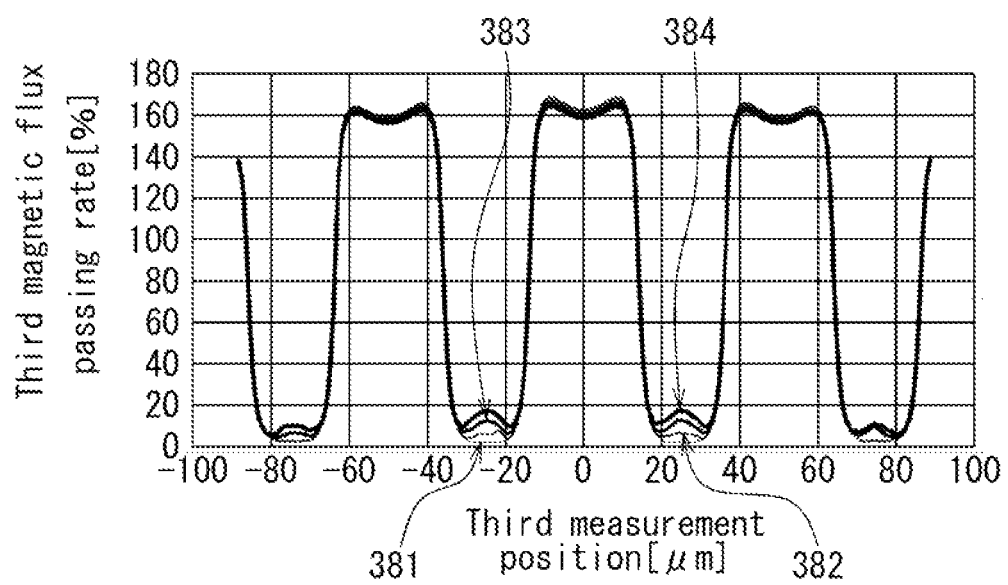
FIG. 28 is a characteristic diagram illustrating part of the simulation results on the third model.

FIG. 28 illustrates part of the simulation results on the third model. In FIG. 28 the horizontal axis represents the third measurement position, and the vertical axis represents the third magnetic flux passing rate. In FIG. 28 the curves labeled 381, 382, 383, and 384 represent the relationship between the third measurement position and the third magnetic flux passing rate when the magnetic flux density By had a value of 360 mT, 380 mT, 400 mT, and 420 mT, respectively.

In the simulation, the relationship between the magnetic flux density By and a normalized magnetic flux passing rate was determined for each of the first to third models. The normalized magnetic flux passing rate of the first model was determined in the following manner. Initially, a range of the first measurement position from −6 µm to 6 µm was defined as a first measurement range. Then, an average value of the first magnetic flux passing rates in the first measurement range was determined at each value of the magnetic flux density By. The average value at each value of the magnetic field density By was then divided by the average value corresponding to the minimum value of the magnetic flux density By used in the simulation on the first model. The value thus obtained was used as the normalized magnetic flux passing rate at each value of the magnetic flux density By.

The normalized magnetic flux passing rate of the second model was determined in the following manner. Initially, a range of the second measurement position from −49 μm to −37 μm and a range of the second measurement position from 37 μm to 49 μm were defined as second measurement ranges. Then, an average value of the second magnetic flux passing rates in the second measurement ranges was determined at each value of the magnetic flux density By. The average value at each value of the magnetic field density By was then divided by the average value corresponding to the minimum value of the magnetic flux density By used in the simulation on the second model. The value thus obtained was used as the normalized magnetic flux passing rate at each value of the magnetic flux density By.

The normalized magnetic flux passing rate of the third model was determined in the following manner. Initially, a range of the third measurement position from −31 μm to −19 μm and a range of the third measurement position from 19 μm to 31 μm were defined as third measurement ranges. Then, an average value of the third magnetic flux passing rates in the third measurement ranges was determined at each value of the magnetic flux density By. The average value at each value of the magnetic field density By was then divided by the average value corresponding to the minimum value of the magnetic flux density By used in the simulation on the third model. The value thus obtained was used as the normalized magnetic flux passing rate at each value of the magnetic flux density By.

Figure 29:
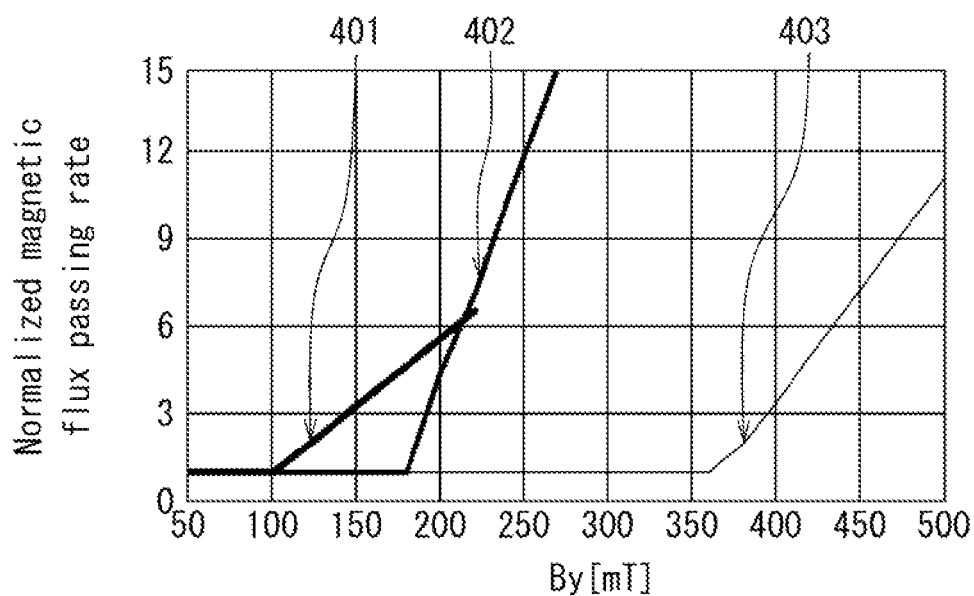
FIG. 29 is a characteristic diagram illustrating the simulation results.

FIG. 29 illustrates the relationship between the magnetic flux density By and the normalized magnetic flux passing rate for each of the first to third models. In FIG. 29 the horizontal axis represents the magnetic flux density By, and the vertical axis represents the normalized magnetic flux passing rate. In FIG. 29, the reference numeral 401 represents the relationship between the magnetic flux density By and the normalized magnetic flux passing rate for the first model; the reference numeral 402 represents the relationship between the magnetic flux density By and the normalized magnetic flux passing rate for the second model; and the reference numeral 403 represents the relationship between the magnetic flux density By and the normalized magnetic flux passing rate for the third model.

As shown in FIG. 29, for all of the first to third models, the normalized magnetic flux passing rate was 1 when the magnetic flux density By was less than or equal to a certain value. When the magnetic flux density By exceeded the certain value, the normalized magnetic flux passing rate became higher than 1. The greater the value of the magnetic flux density By, the higher the normalized magnetic flux passing rate. The higher the normalized magnetic flux passing rate, the lower the capacity of the shields to absorb the second magnetic field component Hy. The value of the magnetic flux density By at which the normalized magnetic flux passing rate started to increase from 1 was the largest for the third model, the second largest for the second model, and the smallest for the first model. This shows that the first feature described in relation to the first embodiment provides the first effect, i.e., the enhancement of the capacity of the shields to absorb the second magnetic field component Hy.

Experimental Results

Now, a description will be given of the results of an experiment comparing the magnetic sensors 30 according to the first to third embodiments in terms of the hysteresis of the detection signal.

Details of the experiment will be described first. Hereinafter, the strength of the magnetic field applied to the magnetic sensor 30 in a direction parallel to the Z direction will be referred to as an applied magnetic field strength and denoted by the symbol Bz. The value of the detection signal of the magnetic field detector 60 will be referred to as a detection signal value and denoted by the symbol DS. The applied magnetic field strength Bz is expressed in a negative value for an applied magnetic field in the −Z direction, and in a positive value for an applied magnetic field in the Z direction. The applied magnetic field strength Bz is expressed in arbitrary units with a maximum value of 100 and a minimum value of −100, 0 indicating the absence of the applied magnetic field. The detection signal value DS is also expressed in arbitrary units. If the detection signal has no hysteresis, the detection signal value DS at an applied magnetic field strength Bz of 0 is 0. The detection signal value at an applied magnetic field strength Bz of 100 is denoted as DSH. The detection signal value at an applied magnetic field strength Bz of −100 is denoted as DSL. The value of DSH-DSL is denoted as DDS.

Figure 30:
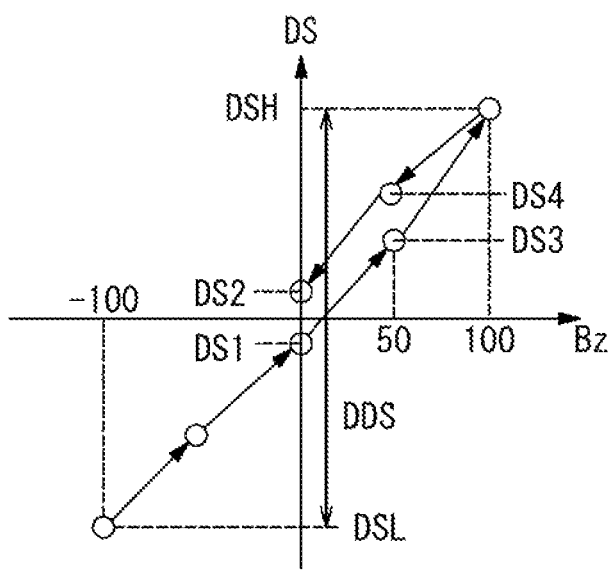
FIG. 30 is an explanatory diagram for describing an experiment performed on the magnetic sensors according to the first to third embodiments of the invention.

FIG. 30 is an explanatory diagram showing the details of the experiment. In the experiment, using the the magnetic sensors 30 according to the first to third embodiments, the detection signal value DS was measured while the applied magnetic field strength Bz was gradually increased from −100 to 100 and then gradually decreased from 100 to 0, as shown in FIG. 30.

In the experiment, the hysteresis of the detection signal was evaluated by using a first hysteresis parameter HP1 and a second hysteresis parameter HP2. The definitions of the first and second hysteresis parameters HP1 and HP2 are described below.

As shown in FIG. 30, the detection signal value DS at which the applied magnetic field strength Bz reaches 0 in the course of the gradual increase from −100 is denoted as DS1. The detection signal value DS at which the applied magnetic field strength Bz reaches 0 as a result of the gradual decrease from 100 is denoted as DS2. The first hysteresis parameter HP1 is the value of (DS2−DS1)/DDS expressed as a percentage.

Further, as shown in FIG. 30, the detection signal value DS at which the applied magnetic field strength Bz reaches 50 in the course of the gradual increase from −100 is denoted as DS3. The detection signal value DS at which the applied magnetic field strength Bz reaches 50 in the course of the gradual decrease from 100 is denoted as DS4. The second hysteresis parameter HP2 is the value of (DS4−DS3)/DDS expressed as a percentage.

Figure 31:
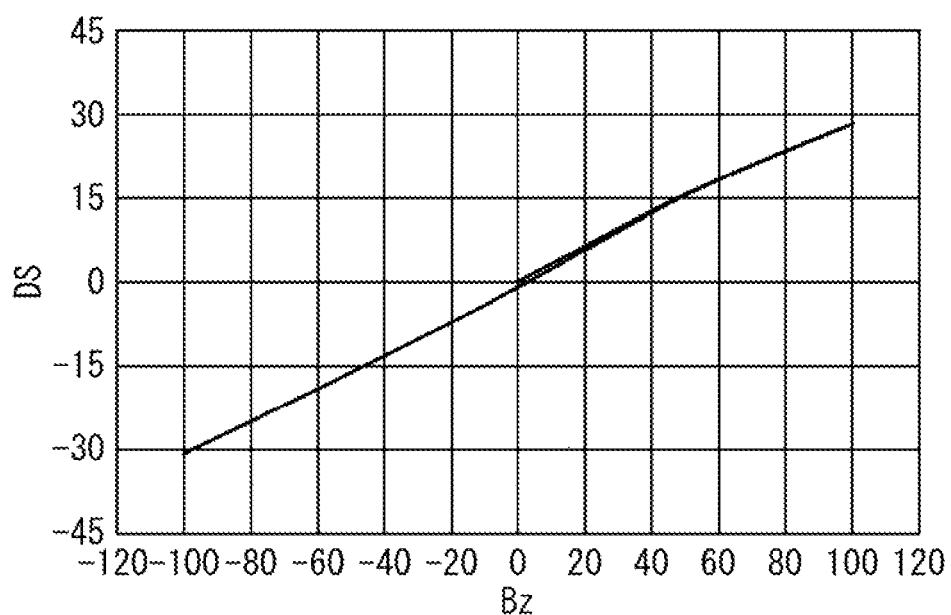
FIG. 31 is a characteristic diagram illustrating the experimental results on the magnetic sensor according to the first embodiment of the invention.
Figure 32:
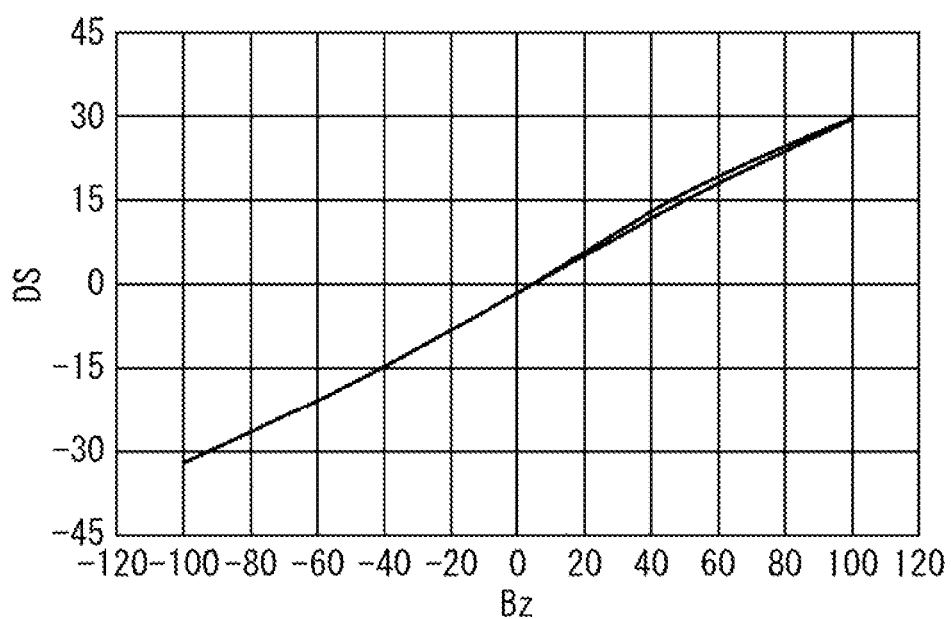
FIG. 32 is a characteristic diagram illustrating the experimental results on the magnetic sensor according to the second embodiment of the invention.
Figure 33:
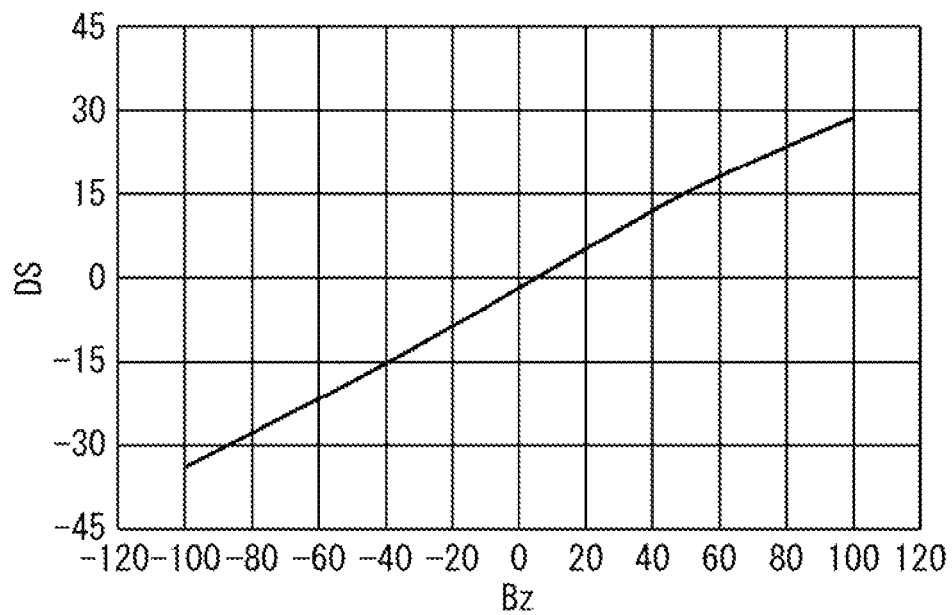
FIG. 33 is a characteristic diagram illustrating the experimental results on the magnetic sensor according to the third embodiment of the invention.

FIG. 31 illustrates the experimental results on one magnetic sensor 30 according to the first embodiment. FIG. 32 illustrates the experimental results on one magnetic sensor 30 according to the second embodiment. FIG. 33 illustrates the experimental results on one magnetic sensor 30 according to the third embodiment. In FIGS. 31 to 33, the horizontal axis represents the applied magnetic field strength Bz, and the vertical axis represents the detection signal value DS.

Figure 34:
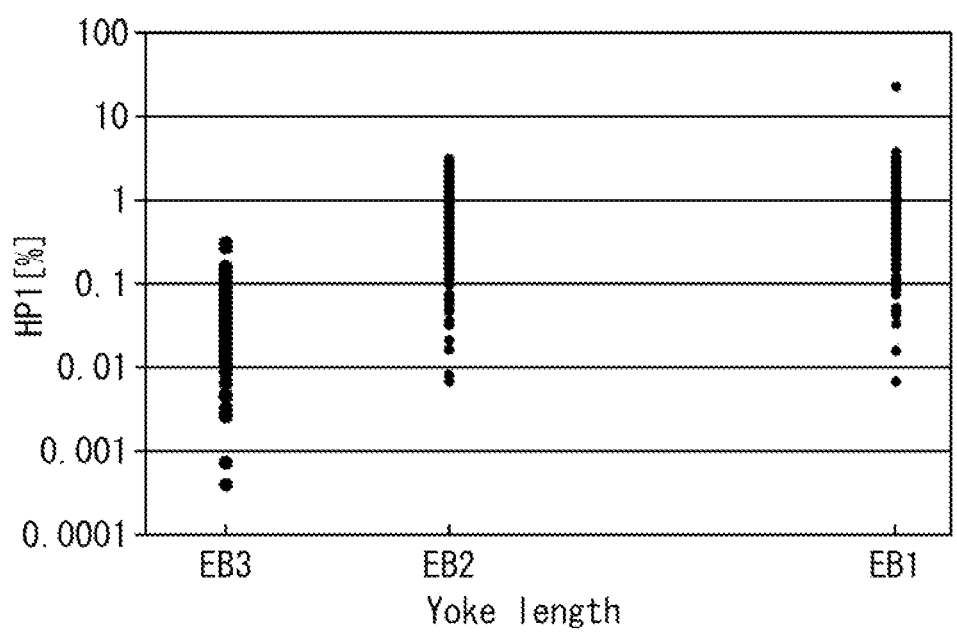
FIG. 34 is a characteristic diagram illustrating the distributions of first hysteresis parameter values of the magnetic sensors according to the first to third embodiments of the invention.
Figure 35:
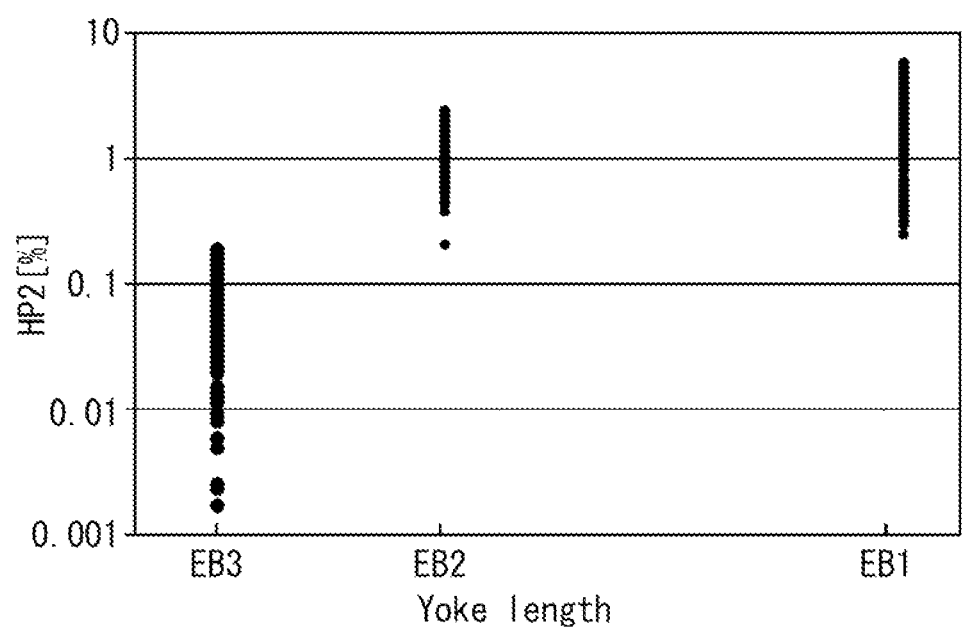
FIG. 35 is a characteristic diagram illustrating the distributions of second hysteresis parameter values of the magnetic sensors according to the first to third embodiments of the invention.

In the experiment, the values of the first and second hysteresis parameters HP1 and HP2 were determined for a plurality of magnetic sensors 30 according to each of the first to third embodiments. FIG. 34 shows the distribution of the values of the first hysteresis parameter HP1. FIG. 35 shows the distribution of the values of the second hysteresis parameter HP2. In FIGS. 34 and 35, the horizontal axis represents the length of the yokes 51. EB1 represents the length of the yokes 51 of the first embodiment. EB2 represents the length of the yokes 51 of the second embodiment. EB3 represents the length of the yokes 51 of the third embodiment. EB1, EB2, and EB3 thus correspond to the first embodiment, the second embodiment, and the third embodiment, respectively. The vertical axis of FIG. 34 indicates the value of the first hysteresis parameter HP1 on a logarithmic scale. The vertical axis of FIG. 35 indicates the value of the second hysteresis parameter HP2 on a logarithmic scale.

As shown in FIG. 34, the distribution of the values of the first hysteresis parameter HP1 for the third embodiment is closer to 0 as compared to the distributions of the values of the first hysteresis parameter HP1 for the first and second embodiments.

As shown in FIG. 35, the distribution of the values of the second hysteresis parameter HP2 for the third embodiment is also closer to 0 as compared to the distributions of the values of the second hysteresis parameter HP2 for the first and second embodiments.

From the experimental results shown in FIGS. 34 and 35, it can be seen that the second effect is more effectively exhibited according to the third embodiment.

The present invention is not limited to the foregoing embodiments, and various modifications may be made thereto. For example, as far as the requirements of the appended claims are met, the shapes, numbers and locations of the MR elements, the yokes and the shields are not limited to the respective examples illustrated in the foregoing embodiments but can be freely chosen. For example, the magnetic sensor of the present invention may include only either one of the two groups of shields, i.e., a first group of shields 71A, 71B, 71C and 71D and a second group of shields 72A, 72B, 72C and 72D.

Further, in the magnetic sensor of the present invention, one or more MR elements 90 may be provided on only one side in the X direction of one yoke 51.

Further, the magnetic field detector 60 may be configured to include the power supply port V, the ground port G, the first output port E1 and the first and second resistor sections 61 and 62, and include none of the second output port E2 and the third and fourth resistor sections 63 and 64. In such a case, the detection signal of the magnetic field detector 60 depends on the potential at the first output port E1.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising:
a magnetic field converter;
a magnetic field detector; and
a plurality of shields separated from each other, each of the plurality of shields being formed of a soft magnetic material, wherein
the magnetic field converter includes one or more yokes each formed of a soft magnetic material,
each of the one or more yokes is configured to receive an input magnetic field for the magnetic sensor and to output an output magnetic field,
the input magnetic field contains an input magnetic field component in a direction parallel to a first direction,
the output magnetic field contains an output magnetic field component in a direction parallel to a third direction, the output magnetic field component varying depending on the input magnetic field component, the third direction intersecting the first direction and a second direction intersecting the first direction,
the magnetic field detector generates a detection signal dependent on the output magnetic field component,
the magnetic field detector includes one or more magnetic detection elements,
each of the one or more magnetic detection elements is configured to receive the output magnetic field and to generate a detection value which varies depending on the output magnetic field component,
the detection signal depends on the detection value,
as viewed in a direction parallel to the first direction, the plurality of shields are aligned in the second direction and overlap the magnetic field converter and the magnetic field detector, and
as viewed in a direction parallel to the first direction, each of the plurality of shields has such a shape that its maximum dimension in the second direction is smaller than its maximum dimension in the third direction, and as viewed in a direction parallel to the third direction, each of the plurality of shields has such a shape that its maximum dimension in the first direction is smaller than its maximum dimension in the second direction.

2. The magnetic sensor according to claim 1, wherein, as viewed in a direction parallel to the first direction, each of the one or more yokes has a shape elongated in the second direction.

3. The magnetic sensor according to claim 1, wherein
the magnetic field detector includes a plurality of magnetic detection elements as the one or more magnetic detection elements, and
as viewed in a direction parallel to the first direction, each of the plurality of magnetic detection elements is located inside a perimeter of any one of the plurality of shields.

4. The magnetic sensor according to claim 3, wherein
the magnetic field converter includes a plurality of yokes as the one or more yokes, and
as viewed in a direction parallel to the first direction, each of the plurality of yokes is located inside the perimeter of any one of the plurality of shields.

5. The magnetic sensor according to claim 3, wherein the plurality of magnetic detection elements constitute one or more trains of elements, each of the one or more trains of elements including two or more of the plurality of magnetic detection elements that are aligned in the second direction along the one or more yokes and connected in series.

6. The magnetic sensor according to claim 5, wherein
the one or more trains of elements are a plurality of trains of elements,
the magnetic field detector includes a power supply port configured to receive a predetermined voltage, a ground port connected to a ground, an output port, a first resistor section provided between the power supply port and the output port, and a second resistor section provided between the output port and the ground port,
each of the first and second resistor sections includes one or more of the plurality of trains of elements, and
the detection signal depends on a potential at the output port.

7. The magnetic sensor according to claim 5, wherein
the one or more trains of elements are four or more trains of elements,
the magnetic field detector includes a power supply port configured to receive a predetermined voltage, a ground port connected to a ground, a first output port, a second output port, a first resistor section provided between the power supply port and the first output port, a second resistor section provided between the first output port and the ground port, a third resistor section provided between the power supply port and the second output port, and a fourth resistor section provided between the second output port and the ground port, each of the first to fourth resistor sections includes one or more of the four or more trains of elements, and the detection signal depends on a potential difference between the first output port and the second output port.

8. The magnetic sensor according to claim 1, wherein the first, second and third directions are orthogonal to one another.

9. The magnetic sensor according to claim 1, wherein each of the one or more magnetic detection elements is a magnetoresistive element, the magnetoresistive element includes a magnetization pinned layer having a magnetization in a predetermined direction, and a free layer having a magnetization whose direction is variable depending on an applied magnetic field, and the detection value varies depending on an angle that the direction of the magnetization of the free layer forms with respect to the direction of the magnetization of the magnetization pinned layer.

10. The magnetic sensor according to claim 9, wherein the direction of the magnetization of the magnetization pinned layer is parallel to the third direction.

11. The magnetic sensor according to claim 1, wherein the input magnetic field contains not only the input magnetic field component but also a magnetic field component in a direction parallel to the second direction.

12. A magnetic sensor system comprising:

the magnetic sensor according to claim 1; and a magnetic field generator for generating a predetermined magnetic field, wherein the magnetic sensor and the magnetic field generator are configured so that a partial magnetic field is applied to the magnetic sensor, the partial magnetic field being part of the predetermined magnetic field, the partial magnetic field contains a first magnetic field component in a direction parallel to the first direction, and a second magnetic field component in a direction parallel to the second direction, the input magnetic field is the partial magnetic field, and the input magnetic field component is the first magnetic field component.

13. The magnetic sensor system according to claim 12, wherein the magnetic sensor and the magnetic field generator are configured so that the first magnetic field component varies as a relative position of the magnetic field generator with respect to the magnetic sensor varies.

14. A magnetic sensor comprising:

a magnetic field converter;

a magnetic field detector; and a plurality of shields separated from each other, each of the plurality of shields being formed of a soft magnetic material, wherein the magnetic field converter includes one or more yokes each formed of a soft magnetic material, the magnetic field detector includes one or more magnetic detection elements, each of the one or more magnetic detection elements is configured to receive an output magnetic field outputted by each of the one or more yokes and to generate a detection value which varies depending on an output magnetic field component contained in the output magnetic field, the output magnetic field component is in a direction parallel to a third direction, the third direction intersecting the first direction and a second direction intersecting the first direction, as viewed in a direction parallel to the first direction, the plurality of shields are aligned in the second direction and overlap the magnetic field converter and the magnetic field detector, and as viewed in a direction parallel to the first direction, each of the plurality of shields has such a shape that its maximum dimension in the second direction is smaller than its maximum dimension in the third direction, and as viewed in a direction parallel to the third direction, each of the plurality of shields has such a shape that its maximum dimension in the first direction is smaller than its maximum dimension in the second direction.

15. The magnetic sensor according to claim 14, wherein, as viewed in a direction parallel to the first direction, each of the one or more yokes has a shape elongated in the second direction.

16. A magnetic sensor comprising:

a magnetic field converter;

a magnetic field detector; and a plurality of shields separated from each other, each of the plurality of shields being formed of a soft magnetic material, wherein the magnetic field converter includes one or more yokes each formed of a soft magnetic material, each of the one or more yokes is configured to receive an input magnetic field for the magnetic sensor and to output an output magnetic field, the input magnetic field contains an input magnetic field component in a direction parallel to a first direction, the output magnetic field contains an output magnetic field component in a direction parallel to a third direction, the output magnetic field component varying depending on the input magnetic field component, the third direction intersecting the first direction and a second direction intersecting the first direction, the magnetic field detector generates a detection signal dependent on the output magnetic field component, the magnetic field detector includes one or more magnetic detection elements, each of the one or more magnetic detection elements is configured to receive the output magnetic field and to generate a detection value which varies depending on the output magnetic field component, the detection signal depends on the detection value, as viewed in a direction parallel to the first direction, the plurality of shields are aligned in the second direction, and as viewed in a direction parallel to the first direction, each of the plurality of shields has such a shape that its maximum dimension in the second direction is smaller than its maximum dimension in the third direction, and as viewed in a direction parallel to the third direction, each of the plurality of shields has such a shape that its maximum dimension in the first direction is smaller than its maximum dimension in the second direction.

17. The magnetic sensor according to claim 16, wherein, as viewed in a direction parallel to the first direction, each of the one or more yokes has a shape elongated in the second direction.

18. A magnetic sensor comprising:

a magnetic field converter;

a magnetic field detector; and a plurality of shields separated from each other, each of the plurality of shields being formed of a soft magnetic material, wherein the magnetic field converter includes one or more yokes each formed of a soft magnetic material, the magnetic field detector includes one or more magnetic detection elements, each of the one or more magnetic detection elements is configured to receive an output magnetic field outputted by each of the one or more yokes and to generate a detection value which varies depending on an output magnetic field component contained in the output magnetic field, the output magnetic field component is in a direction parallel to a third direction, the third direction intersecting the first direction and a second direction intersecting the first direction, as viewed in a direction parallel to the first direction, the plurality of shields are aligned in the second direction, and as viewed in a direction parallel to the first direction, each of the plurality of shields has such a shape that its maximum dimension in the second direction is smaller than its maximum dimension in the third direction, and as viewed in a direction parallel to the third direction, each of the plurality of shields has such a shape that its maximum dimension in the first direction is smaller than its maximum dimension in the second direction.

19. The magnetic sensor according to claim 18, wherein, as viewed in a direction parallel to the first direction, each of the one or more yokes has a shape elongated in the second direction.

* * * * *